United States Patent
Matsumoto et al.

(10) Patent No.: US 6,806,537 B2
(45) Date of Patent: Oct. 19, 2004

(54) SEMICONDUCTOR DEVICE HAVING OFFSET INSULATION FILM FORMED ON INSULATION FILM, AND METHOD OF MANUFACTURING THE SAME

(75) Inventors: Takuji Matsumoto, Tokyo (JP); Hirokazu Sayama, Tokyo (JP); Shigenobu Maeda, Tokyo (JP); Toshiaki Iwamatsu, Tokyo (JP); Kazunobu Ota, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/192,657

(22) Filed: Jul. 11, 2002

(65) Prior Publication Data

US 2003/0025135 A1 Feb. 6, 2003

(30) Foreign Application Priority Data

Jul. 17, 2001 (JP) .................................... P2001-216428
Sep. 28, 2001 (JP) .................................... P2001-299863

(51) Int. Cl.[7] ............................................. H01L 27/01
(52) U.S. Cl. ....................................... 257/347; 257/382
(58) Field of Search ................................... 257/347, 382

(56) References Cited

U.S. PATENT DOCUMENTS

| | | | |
|---|---|---|---|
| 5,591,650 A | | 1/1997 | Hsu et al. |
| 6,004,853 A | * | 12/1999 | Yang et al. ............... 438/305 |
| 6,049,114 A | | 4/2000 | Maiti et al. |
| 6,121,100 A | * | 9/2000 | Andideh et al. .......... 438/305 |
| 6,249,026 B1 | | 6/2001 | Matsumoto et al. |
| 6,399,451 B1 | | 6/2002 | Lim et al. |

FOREIGN PATENT DOCUMENTS

| | | |
|---|---|---|
| JP | 8-204188 | 8/1996 |
| JP | 2000-101059 | 4/2000 |

OTHER PUBLICATIONS

U.S. patent application Ser. No. 09/464,436, filed Dec. 16, 1999, pending.

H. Sayama, et al. "80nm CMOSFET Technology Using Double Offset–Implanted Source/Drain Extension and Low Temperature SiN Process" IEDM, pp. 239–242.

* cited by examiner

*Primary Examiner*—Thanh Nguyen
(74) *Attorney, Agent, or Firm*—Oblon, Spivak, McClelland, Maier & Neustadt, P.C.

(57) ABSTRACT

A semiconductor device which achieves reductions in malfunctions and operating characteristic variations by reducing the gain of a parasitic bipolar transistor, and a method of manufacturing the same are provided. A silicon oxide film (6) is formed partially on the upper surface of a silicon layer (3). A gate electrode (7) of polysilicon is formed partially on the silicon oxide film (6). A portion of the silicon oxide film (6) underlying the gate electrode (7) functions as a gate insulation film. A silicon nitride film (9) is formed on each side surface of the gate electrode (7), with a silicon oxide film (8) therebetween. The silicon oxide film (8) and the silicon nitride film (9) are formed on the silicon oxide film (6). The width (W1) of the silicon oxide film (8) in a direction of the gate length is greater than the thickness (T1) of the silicon oxide film (6).

4 Claims, 37 Drawing Sheets

F I G. 4 6 *PRIOR ART*
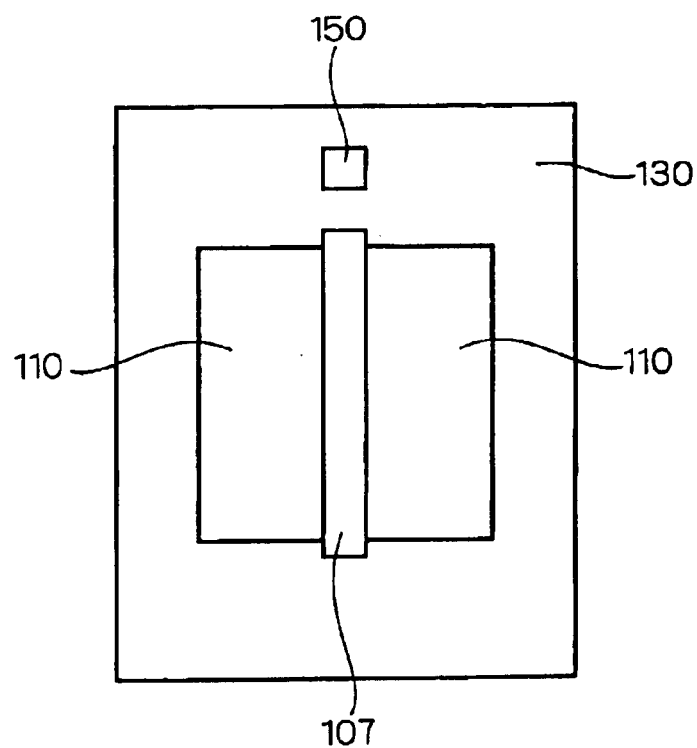

SEMICONDUCTOR DEVICE HAVING OFFSET INSULATION FILM FORMED ON INSULATION FILM, AND METHOD OF MANUFACTURING THE SAME

BACKGROUND OF THE INVENTION

1. Field of the Invention

The present invention relates to a semiconductor device and a method of manufacturing the same. More particularly, the invention relates to a MOSFET (Metal Oxide Semiconductor Field Effect Transistor) employing an SOI (Silicon-On-Insulator) substrate and a method of manufacturing the same.

2. Description of the Background Art

Attention has been given to a semiconductor device (SOI device) employing an SOI substrate as a high-operating-speed, low-power-consumption device. The SOI substrate has a multi-layer structure including a semiconductor substrate, an insulation layer and a semiconductor layer which are stacked in the order named. An SOI device (thin-film SOI device) having a semiconductor layer thinned to about several micrometers has recently received particular attention, and has been expected to be applied to LSI circuits for portable equipment.

FIG. 44 is a sectional view showing a structure of a background art semiconductor device. An SOI substrate 104 has a multi-layer structure such that a silicon substrate 101, a BOX (Buried OXide) layer 102 and a silicon layer 103 are stacked in the order named. An isolating insulation film 105 made of silicon oxide is partially formed in the silicon layer 103. The isolating insulation film 105 extends from the upper surface of the silicon layer 103 to the upper surface of the BOX layer 102. The isolating insulation film having such a configuration is referred to as a "completely isolating insulation film."

A MOSFET is formed in a device region defined by the isolating insulation film 105 in a manner to be specifically described below. A silicon oxide film 106 is formed partially on the upper surface of the silicon layer 103. A gate electrode 107 made of polysilicon is formed partially on the silicon oxide film 106. A portion of the silicon oxide film 106 which lies under the gate electrode 107 functions as a gate insulation film. A silicon nitride film 109 is formed on each side surface of the gate electrode 107, with a silicon oxide film 108 therebetween. The silicon oxide films 108 are formed not only between the side surfaces of the gate electrode 107 and side surfaces of the silicon nitride films 109 but also between the upper surface of the silicon oxide film 106 and the lower surface of the silicon nitride films 109.

A pair of source/drain regions 110 are formed in the silicon layer 103. A region between the pair of source/drain regions 110 is defined as a body region 112. Each of the source/drain regions 110 has an extension 111 extending to under the gate electrode 107 in the upper surface of the silicon layer 103.

FIG. 45 is a sectional view showing a structure of another background art semiconductor device. The semiconductor device shown in FIG. 45 has an isolating insulation film 130 made of silicon oxide in place of the completely isolating insulation film 105 shown in FIG. 44. The lower surface of the isolating insulation film 130 does not reach the upper surface of the BOX layer 102. The isolating insulation film having such a configuration is referred to as a "partially isolating insulation film." The remaining structure of the semiconductor device shown in FIG. 45 is similar to the corresponding structure of the semiconductor device shown in FIG. 44.

FIG. 46 is a schematic top plan view showing a top surface structure of the semiconductor device shown in FIG. 45. The use of the partially isolating insulation film 130 allows the body region 112 to be tied to a fixed potential through a portion of the silicon layer 103 which lies between the lower surface of the isolating insulation film 130 and the upper surface of the BOX layer 102 from a body contact region 150. This suppresses a so-called floating body effect such as the occurrence of a kink effect and variations in delay time depending on an operating frequency.

Referring again to FIGS. 44 and 45, the width W101 of the silicon oxide film 108 in a direction of the gate length (or in the lateral direction as viewed in the drawings) is less than the total thickness T101 of the silicon oxide film 106 and the silicon oxide film 108. In some cases, however, a portion of the silicon oxide film 106 other than functioning as the gate insulation film (i.e., a portion of the silicon oxide film 106 which lies between the lower surface of the silicon oxide film 108 and the upper surface of the silicon layer 103 as viewed in FIG. 44) is removed away during a gate etching process, in which case the width W101 is equal to the total thickness T101. Thus, the width W101 is not greater than the total thickness T101 in the background art semiconductor devices.

Unfortunately, in such background art semiconductor devices, the relatively small width W101 of the silicon oxide film 108 results in a relatively short distance L101 between the pair of source/drain regions 110 (more specifically, between the pair of extensions 111).

In the semiconductor devices shown in FIGS. 44 and 45, there is a parasitic bipolar transistor with the source/drain regions 110 serving as an emitter and a collector and the body region 112 serving as a base. The short distance L101 between the pair of source/drain regions 110 means a small base width of the parasitic bipolar transistor, resulting in high gain of the parasitic bipolar transistor. As a result, the background art semiconductor devices present a problem such that there is a danger that the high gain of the parasitic bipolar transistor causes a malfunction and a variation in operating characteristics of the MOSFET.

SUMMARY OF THE INVENTION

It is an object of the present invention to provide a semiconductor device which achieves reductions in malfunctions and operating characteristic variations by reducing the gain of a parasitic bipolar transistor, and a method of manufacturing the same.

According to a first aspect of the present invention, the semiconductor device includes an SOI substrate, a first insulation film, a gate electrode, a pair of second insulation films, a pair of third insulation films, a body region, and a pair of source/drain regions. The SOI substrate has a multi-layer structure including a semiconductor substrate, an insulation layer and a semiconductor layer stacked in the order named. The first insulation film is formed on a main surface of the semiconductor layer. The gate electrode is formed on the first insulation film. The pair of second insulation films have respective inner side surfaces in contact with side surfaces of the gate electrode and respective outer side surfaces out of contact with the side surfaces of the gate electrode, with the gate electrode disposed between the pair of second insulation films. The pair of third insulation films are formed on the main surface of the semiconductor layer, with the first insulation film therebetween. The pair of third insulation films have respective inner side surfaces in contact with the outer side surfaces of the second insulation films and respective outer side surfaces out of contact with the outer side surfaces of the second insulation films, with the gate electrode and the second insulation films disposed between the pair of third insulation films. The body region is formed in the semiconductor layer under the gate electrode. The pair of source/drain regions are formed in the semiconductor layer, with the body region disposed between the pair of source/drain regions. The source/drain regions have respective extensions extending from under the outer side surfaces of the second insulation films toward the body region in the main surface of the semiconductor layer. The width of the second insulation films in a direction of gate length is greater than the thickness of a portion of the first insulation film underlying the third insulation films.

In the semiconductor device according to the present invention, the relatively large width of the second insulation films leads to a relatively long distance between the pair of extensions formed by ion implantation using the second insulation films as an implant mask. Accordingly increased base width of a parasitic bipolar transistor reduces the gain of the parasitic bipolar transistor, thereby to suppress malfunctions and operating characteristic variations of the MOSFET. Additionally, a decreased amount of overlap between the gate electrode and the extensions as viewed in plan suppresses a gate overlap capacitance to achieve the increase in operating speed and the reduction in power consumption.

Preferably, in the semiconductor device, the width of the second insulation films is in the range of 2/7 to 1 times the gate length.

The semiconductor device achieves the stable formation of the gate electrode and suppresses the reduction in maximum oscillation frequency.

Preferably, in the semiconductor device, a lifetime killer is formed in the main surface of the semiconductor layer.

The semiconductor device, in which the lifetime killer for the parasitic bipolar transistor is formed in the main surface of the semiconductor layer, reduces the gain of the parasitic bipolar transistor.

Preferably, in the semiconductor device, a portion of the main surface of the semiconductor layer on which the third insulation films are formed is sunk toward the insulation layer below a portion of the main surface of the semiconductor layer on which the second insulation films are formed.

In the semiconductor device, etching the upper surface of the semiconductor layer as well in the etching step for the formation of the second insulation films creates the lifetime killer in the main surface of the semiconductor layer.

Preferably, in the semiconductor device, a portion of the main surface of the semiconductor layer positioned outside the outer side surfaces of the third insulation films is sunk toward the insulation layer below a portion of the main surface of the semiconductor layer on which the third insulation films are formed.

In the semiconductor device, etching the upper surface of the semiconductor layer as well in the etching step for the formation of the third insulation films creates the lifetime killer in the main surface of the semiconductor layer.

Preferably, the semiconductor device further includes a metal-semiconductor compound layer formed on the source/drain regions.

In the semiconductor device, forming the metal-semiconductor compound layer on the source/drain regions creates the lifetime killer in the main surface of the semiconductor layer.

Preferably, in the semiconductor device, the third insulation films are made of silicon nitride. The third insulation films are formed directly on the main surface of the semiconductor layer without the first insulation film therebetween.

In the semiconductor device, stresses caused at an interface between the silicon nitride film and the semiconductor layer create the lifetime killer in the main surface of the semiconductor layer.

Preferably, the semiconductor device is a MOSFET. The MOSFET includes an NMOSFET and a PMOSFET both formed in the semiconductor layer. The width of the second insulation films included in the NMOSFET is greater than the width of the second insulation films included in the PMOSFET.

The semiconductor device suppresses a floating body effect problem in the NMOSFET to achieve the increase in operating speed and an improvement in current driving capability.

Preferably, the semiconductor device is a MOSFET. The MOSFET includes an NMOSFET and a PMOSFET both formed in the semiconductor layer. The width of the second insulation films included in the PMOSFET is greater than the width of the second insulation films included in the NMOSFET.

The semiconductor device suppresses the occurrence of a short channel effect in the PMOSFET. This improves the roll-off characteristic of the PMOSFET to suppress the increase in off-state current, thereby achieving the reduction in power consumption.

According to a second aspect of the present invention, the semiconductor device includes a substrate, a first semiconductor element, and a second semiconductor element. The substrate has a first region with a digital circuit formed therein, and a second region with an analog or RF (radio frequency) circuit formed therein. The first semiconductor element is formed in the first region and constitutes the digital circuit. The second semiconductor element is formed in the second region and constitutes the analog or RF circuit. The first semiconductor element includes a first gate electrode formed on a main surface of the substrate, with a first gate insulation film therebetween, a first body region formed in the substrate under the first gate electrode, and a pair of first source/drain regions formed in the substrate, with the first body region disposed between the pair of first source/drain regions. The second semiconductor element includes a second gate electrode formed on the main surface of the substrate, with a second gate insulation film therebetween, a second body region formed in the substrate under the second gate electrode, and a pair of second source/drain regions formed in the substrate, with the second body region disposed between the pair of second source/drain regions. The pair of first source/drain regions have a pair of first extensions, respectively, extending toward under the first gate electrode in the main surface of the semiconductor layer. The pair of second source/drain regions have a pair of second extensions, respectively, extending toward under the second gate electrode in the main surface of the semiconductor layer. The amount of overlap between the first gate electrode and the first extensions as viewed in plan is greater than the amount of overlap between the second gate electrode and the second extensions.

The semiconductor device reduces an effective channel length to shorten delay time, thereby improving the performance for the first semiconductor element constituting the digital circuit.

Preferably, in the semiconductor device, the first semiconductor element further includes a first sidewall formed on a side surface of the first gate electrode. The second semiconductor element further includes a first insulation film formed on a side surface of the second gate electrode, and a second sidewall formed on the side surface of the second gate electrode, with the first insulation film therebetween.

In the semiconductor device, performing ion implantation to form the second extensions after the first insulation film serving as an offset insulation film is formed suppresses a gate overlap capacitance for the second semiconductor element constituting the analog or RF circuit.

Preferably, in the semiconductor device, the first semiconductor element further includes a second insulation film formed between the first gate electrode and the first sidewall, the second insulation film being in contact with the side surface of the first gate electrode. The first insulation film includes a third insulation film formed in contact with the side surface of the second gate electrode, the third insulation film being equal in thickness to the second insulation film, and a fourth insulation film formed between the third insulation film and the second sidewall.

In the semiconductor device, performing ion implantation to form the first extensions after the second insulation film serving as an offset insulation film is formed suppresses a gate overlap capacitance for the first semiconductor element constituting the digital circuit.

According to a third aspect of the present invention, the semiconductor device includes a substrate, a semiconductor element, an interlayer insulation film, and a gate interconnect line. The semiconductor element includes (a) a gate electrode formed on a main surface of the substrate, with a gate insulation film therebetween, and extending in a predetermined direction, (b) a first sidewall formed on a side surface of the gate electrode, (c) a body region formed in the substrate under the gate electrode, and (d) a pair of source/drain regions formed in the substrate, with the body region disposed between the pair of source/drain regions. The interlayer insulation film is formed on the substrate to cover the semiconductor element. The gate interconnect line is in contact with an upper surface of the gate electrode and extends in the predetermined direction, the gate interconnect line being formed in the interlayer insulation film. A dimension of the gate interconnect line in a direction of gate length of the gate electrode is greater than the gate length of the gate electrode.

The semiconductor device decreases a gate resistance to increase the maximum oscillation frequency of the semiconductor element.

Preferably, the semiconductor device further includes a second sidewall formed on the side surface of the gate electrode, with the first sidewall therebetween.

In the semiconductor device, the formation of the second sidewall improves a misalignment margin in manufacturing steps of the semiconductor device.

Preferably, in the semiconductor device, a dimension of the second sidewall in the direction of the gate length is greater than a dimension of the first sidewall in the direction of the gate length.

The semiconductor device further improves the misalignment margin in the manufacturing steps of the semiconductor device.

Preferably, the semiconductor device further includes a contact plug connected to the source/drain regions and formed in the interlayer insulation film. The dimension of the gate interconnect line in the direction of the gate length is less than a dimension of the contact plug in the direction of the gate length.

The semiconductor device reduces an etch rate difference when forming a contact hole for the contact plug and an interconnect trench for the gate interconnect line in the same etching step in the manufacturing process of the semiconductor device.

According to a fourth aspect of the present invention, the method of manufacturing a semiconductor device includes the following steps (a) to (g). The step (a) is to prepare an SOI substrate having a multi-layer structure including a semiconductor substrate, an insulation layer and a semiconductor layer stacked in the order named. The step (b) is to form a first insulation film on a main surface of the semiconductor layer. The step (c) is to form a gate electrode on the first insulation film. The step (d) is to form a pair of second insulation films having respective inner side surfaces in contact with side surfaces of the gate electrode and respective outer side surfaces out of contact with the side surfaces of the gate electrode, with the gate electrode disposed between the pair of second insulation films, the width of the second insulation films in a direction of gate length being greater than the thickness of the first insulation film. The step (e) is to introduce an impurity into the main surface of the semiconductor layer to form a pair of extensions, the step (e) being performed after the step (d). The step (f) is to form a pair of third insulation films having respective inner side surfaces in contact with the outer side surfaces of the second insulation films and respective outer side surfaces out of contact with the outer side surfaces of the second insulation films, with the gate electrode and the second insulation films disposed between the pair of third insulation films. The step (g) is to introduce an impurity into the semiconductor layer to form a pair of source/drain regions, the step (g) being performed after the step (f).

In the method according to the present invention, the relatively large width of the second insulation films leads to a relatively long distance between the pair of extensions formed in the step (e). Accordingly increased base width of a parasitic bipolar transistor reduces the gain of the parasitic bipolar transistor, thereby to suppress malfunctions and operating characteristic variations of the MOSFET. Additionally, a decreased amount of overlap between the gate electrode and the extensions as viewed in plan suppresses a gate overlap capacitance to achieve the increase in operating speed and the reduction in power consumption.

Preferably, in the method, the width of the second insulation films formed in the step (d) is in the range of $2/7$ to 1 times the gate length.

The method achieves the stable formation of the gate electrode and suppresses the reduction in maximum oscillation frequency.

Preferably, the method further includes the step of (h) forming a lifetime killer in the main surface of the semiconductor layer.

The method, in which the lifetime killer for the parasitic bipolar transistor is formed in the main surface of the semiconductor layer, reduces the gain of the parasitic bipolar transistor.

Preferably, in the method, the step (h) includes the step of etching a portion of the main surface of the semiconductor layer on which the third insulation films are formed.

In the method, etching the portion of the main surface of the semiconductor layer on which the third insulation films are formed creates the lifetime killer in the main surface of the semiconductor layer.

Preferably, in the method, the step (h) includes the step of etching a portion of the main surface of the semiconductor layer positioned outside the outer side surfaces of the third insulation films.

In the method, etching the portion of the main surface of the semiconductor layer positioned outside the outer side surfaces of the third insulation films creates the lifetime killer in the main surface of the semiconductor layer.

Preferably, in the method, the step (h) includes the step of forming a metal-semiconductor compound layer on the source/drain regions.

In the method, forming the metal-semiconductor compound layer on the source/drain regions creates the lifetime killer in the main surface of the semiconductor layer.

Preferably, in the method, the third insulation films are made of silicon nitride, and the step (h) includes the step of forming the third insulation films directly on the main surface of the semiconductor layer.

In the method, stresses caused at an interface between the silicon nitride film and the semiconductor layer create the lifetime killer in the main surface of the semiconductor layer.

Preferably, in the method, the semiconductor device is a MOSFET. The MOSFET includes an NMOSFET and a PMOSFET both formed in the semiconductor layer. The step (d) includes the steps of: (d-1) forming the second insulation films having a first width in a region in which the PMOSFET is to be formed; and (d-2) forming the second insulation films having a second width greater than the first width in a region in which the NMOSFET is to be formed.

The method suppresses a floating body effect problem in the NMOSFET to achieve the increase in operating speed and an improvement in current driving capability.

Preferably, in the method, the semiconductor device is a MOSFET. The MOSFET includes an NMOSFET and a PMOSFET both formed in the semiconductor layer. The step (d) includes the steps of: (d-1) forming the second insulation films having a first width in a region in which the NMOSFET is to be formed; and (d-2) forming the second insulation films having a second width greater than the first width in a region in which the PMOSFET is to be formed.

The method suppresses the occurrence of a short channel effect in the PMOSFET. This improves the roll-off characteristic of the PMOSFET to suppress the increase in off-state current, thereby achieving the reduction in power consumption.

According to a fifth aspect of the present invention, the method of manufacturing a semiconductor device includes the following steps (a) to (f). The step (a) is to prepare a substrate having a first region in which a digital circuit is to be formed, and a second region in which an analog or RF circuit is to be formed. The step (b) is to form a first gate electrode on a main surface of the substrate in the first region, with a first gate insulation film therebetween, and a second gate electrode on the main surface of the substrate in the second region, with a second gate insulation film therebetween. The step (c) is to form a first insulation film on a side surface of the second gate electrode. The step (d) is to form a first sidewall on a side surface of the first gate electrode, and a second sidewall on the side surface of the second gate electrode, with the first insulation film therebetween. The step (e) is to introduce an impurity into the main surface of the substrate in the first region to form a pair of first extensions extending toward under the first gate electrode, the step (e) being performed before the step (d). The step (f) is to introduce an impurity into the main surface of the substrate in the second region to form a pair of second extensions extending toward under the second gate electrode, the step (f) being performed after the step (c) and before the step (d).

The method reduces the effective channel length of a semiconductor element constituting the digital circuit to shorten delay time, thereby improving the performance. Additionally, forming the second extensions in the step (f) after the first insulation film serving as an offset insulation film is formed in the step (c) suppresses a gate overlap capacitance for a semiconductor element constituting the analog or RF circuit.

Preferably, the method further includes the step of (g) forming a second insulation film in contact with the side surface of the first gate electrode, the step (g) being performed before the step (e). The step (c) includes the steps of (c-1) forming a third insulation film in contact with the side surface of the second gate electrode, the step (c-1) being performed in the same step as the step (g), and (c-2) forming a fourth insulation film on the side surface of the second gate electrode, with the third insulation film therebetween.

In the method, forming the first extensions in the step (e) after the second insulation film serving as an offset insulation film is formed in the step (g) suppresses a gate overlap capacitance for the semiconductor element constituting the digital circuit.

According to a sixth aspect of the present invention, the method of manufacturing a semiconductor device includes the following steps (a) to (e). The step (a) is to prepare a substrate. The step (b) is to form a gate electrode extending in a predetermined direction on a main surface of the substrate, with a gate insulation film therebetween. The step (c) is to form a first sidewall on a side surface of the gate electrode. The step (d) is to form an interlayer insulation film on the substrate to cover the gate electrode and the first sidewall. The step (e) is to form a gate interconnect line in the interlayer insulation film, the gate interconnect line being in contact with an upper surface of the gate electrode and extending in the predetermined direction, wherein a dimension of the gate interconnect line in a direction of gate length of the gate electrode is greater than the gate length of the gate electrode.

The method provides a semiconductor device which decreases a gate resistance to increase the maximum oscillation frequency.

Preferably, the method further includes the step of (f) forming a second sidewall on the side surface of the gate electrode, with the first sidewall therebetween, the step (f) being performed before the step (d).

In the method, the formation of the second sidewall improves a misalignment margin in step of forming an interconnect trench for the gate interconnect line.

Preferably, in the method, a dimension of the second sidewall formed in the step (f) in the direction of the gate length is greater than a dimension of the first sidewall in the direction of the gate length.

The method further improves the misalignment margin.

Preferably, the method further includes the steps of: (s) forming a pair of source/drain regions in the substrate, with a body region under the gate electrode disposed between the pair of source/drain regions; and (t) forming a contact plug in the interlayer insulation film, the contact plug being connected to the source/drain regions, the step (t) being performed in the same step as the step (e), wherein a dimension of the contact plug in the direction of the gate length is greater than the dimension of the gate interconnect line in the direction of the gate length.

The method reduces an etch rate difference when forming a contact hole for the contact plug and an interconnect trench for the gate interconnect line in the same etching step.

These and other objects, features, aspects and advantages of the present invention will become more apparent from the following detailed description of the present invention when taken in conjunction with the accompanying drawings.

BRIEF DESCRIPTION OF THE DRAWINGS

FIG. 46 is a schematic top plan view showing a top surface structure of the semiconductor device shown in FIG. 45.

DESCRIPTION OF THE PREFERRED EMBODIMENTS

First Preferred Embodiment

Figure 1:
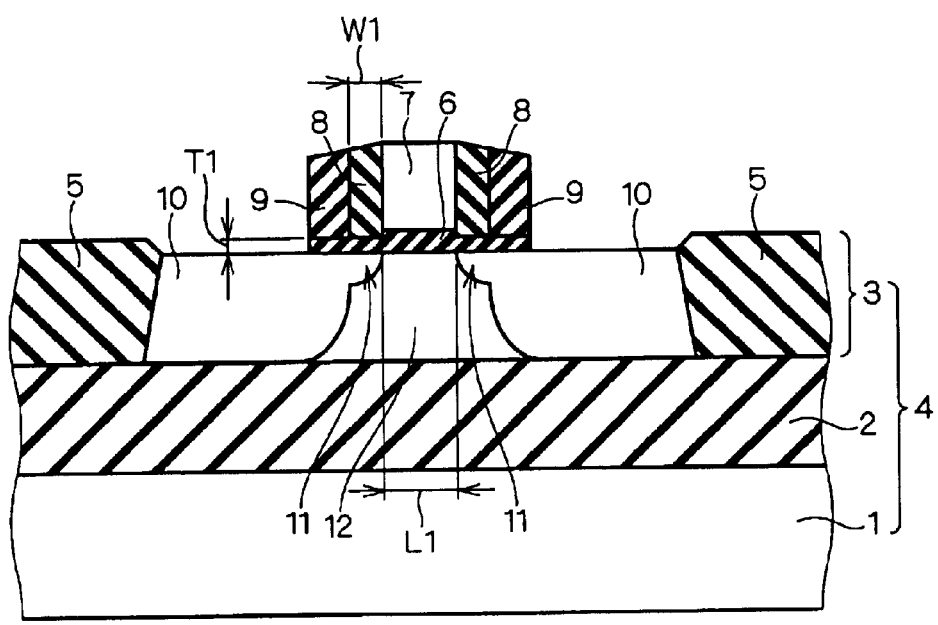
FIG. 1 is a sectional view showing a structure of a semiconductor device according to a first preferred embodiment of the present invention.

FIG. 1 is a sectional view showing a structure of a semiconductor device according to a first preferred embodiment of the present invention An SOI substrate 4 has a multi-layer structure such that a silicon substrate 1, a BOX layer 2 and a single-crystalline silicon layer 3 are stacked in the order named. The single-crystalline silicon layer 3 may be replaced with a polycrystalline or amorphous silicon layer. A completely isolating insulation film 5 made of silicon oxide is partially formed in the silicon layer 3. The isolating insulation film 5 extends from the upper surface of the silicon layer 3 to the upper surface of the BOX layer 2.

A MOSFET is formed in a device region defined by the isolating insulation film 5 in a manner to be specifically described below. A silicon oxide film 6 is formed partially on the upper surface of the silicon layer 3. A gate electrode 7 made of polysilicon is formed partially on the silicon oxide film 6. A portion of the silicon oxide film 6 which lies under the gate electrode 7 functions as a gate insulation film. A silicon nitride film 9 is formed on each side surface of the gate electrode 7, with a silicon oxide film 8 therebetween. The silicon oxide film 8 and the silicon nitride film 9 are formed on the silicon oxide film 6. The width W1 of the silicon oxide film 8 in a direction of the gate length (or in the lateral direction as viewed in the drawing) is greater than the thickness T1 of the silicon oxide film 6.

Side surfaces of the silicon oxide films 8 which are in contact with the side surfaces of the gate electrode 7 are herein defined as "inner side surfaces," and side surfaces thereof which are out of contact with the side surfaces of the gate electrodes 7 are defined as "outer side surfaces." Side surfaces of the silicon nitride films 9 which are in contact with the outer side surfaces of the silicon oxide films 8 are herein defined as "inner side surfaces," and side surfaces thereof which are out of contact with the outer side surfaces of the silicon oxide films 8 are defined as "outer side surfaces."

A pair of source/drain regions 10 are formed in the silicon layer 3. A region between the pair of source/drain regions 10 is defined as a body region 12. Each of the source/drain regions 10 has an extension (or LDD when having a relatively low impurity concentration) 11 extending from under the outer side surface of a corresponding one of the silicon oxide films 8 toward the body region 12 in the upper surface of the silicon layer 3.

Figure 2:
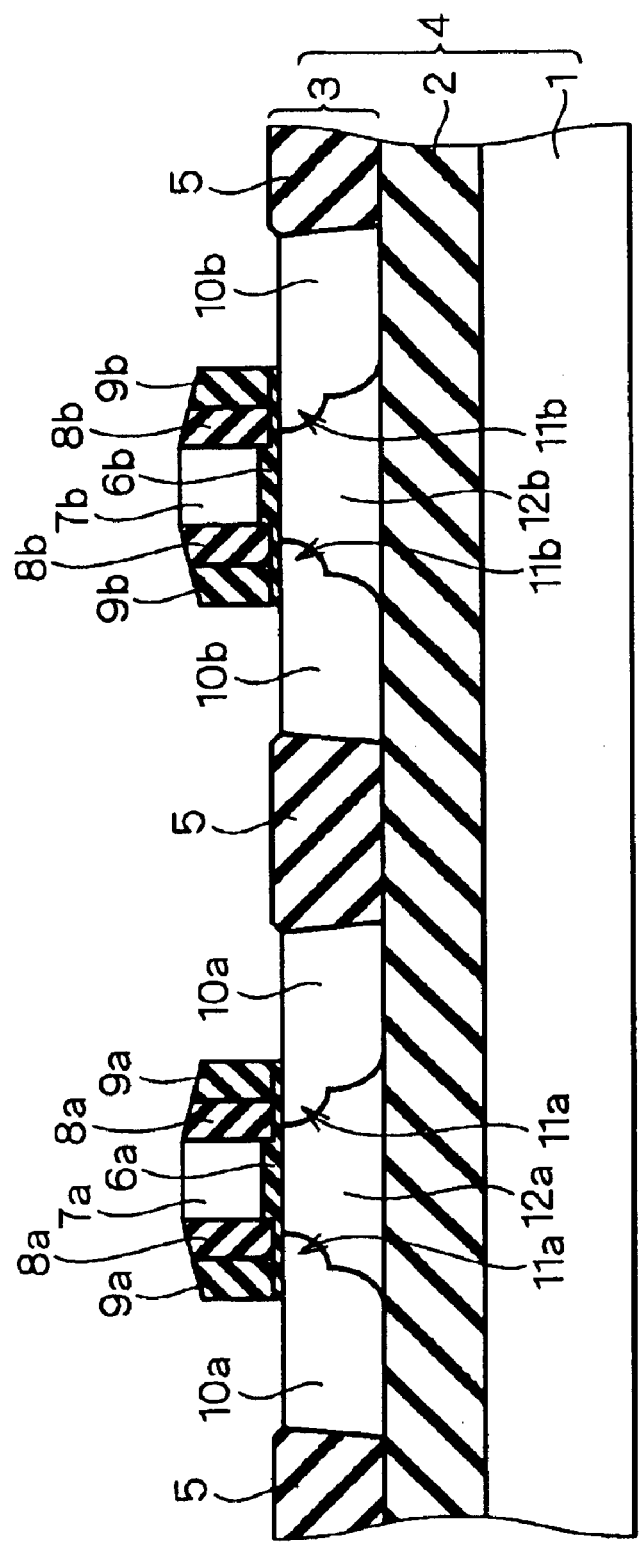
FIG. 2 is a sectional view showing an NMOSFET and a PMOSFET according to the first preferred embodiment as formed on the same SOI substrate.

FIG. 2 is a sectional view showing an NMOSFET and a PMOSFET according to the first preferred embodiment as formed on the same SOI substrate 4. The NMOSFET is formed in a device region defined by the left-hand isolating insulation film 5 and the middle isolating insulation film 5 as viewed in FIG. 2, and the PMOSFET is formed in a device region defined by the right-hand isolating insulation film 5 and the middle isolating insulation film 5. The NMOSFET and the PMOSFET are identical in construction with the structure shown in FIG. 1.

Figure 3:
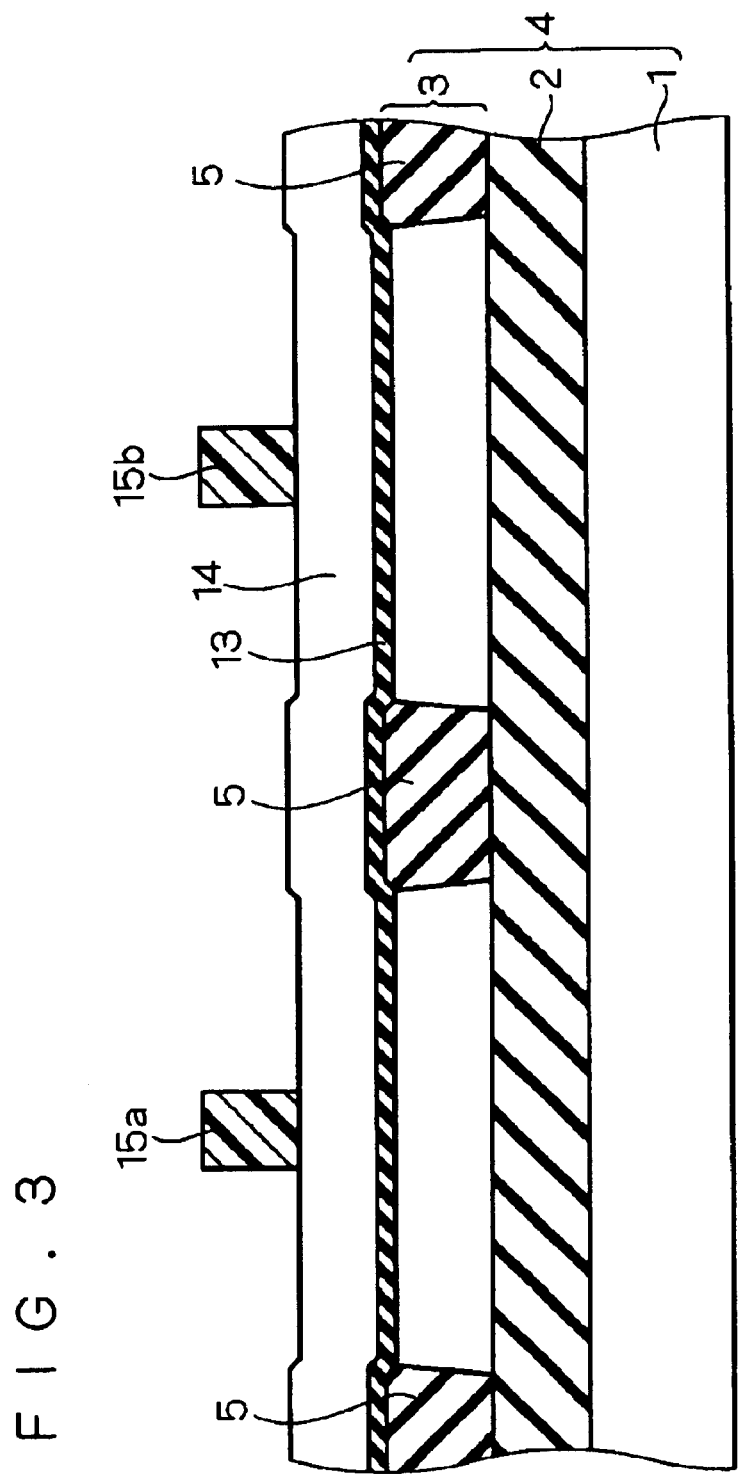
FIGS. 3 through 12 are sectional views showing a method of manufacturing the semiconductor device in a step-by-step manner according to the first preferred embodiment.

FIGS. 3 through 12 are sectional views showing a method of manufacturing the semiconductor device shown in FIG. 2 in a step-by-step manner. Referring first to FIG. 3, the SOI substrate 4 is prepared, and then the isolating insulation film 5 are formed in the silicon layer 3. Next, a silicon oxide film 13 is formed entirely on the upper surface of the silicon layer 3 and the upper surface of the isolating insulation film 5 by a CVD process or a thermal oxidation process. A silicon oxynitride film, a metal oxide film such as $Al_2O_3$ or a ferroelectric film such as $Ta_2O_5$ and BST may be formed in place of the silicon oxide film 13. Next, a polysilicon film 14 having a thickness of about 100 nm to about 400 nm is formed entirely on the upper surface of the silicon oxide film 13 by an LPCVD process. The polysilicon film 14 may be doped with an impurity such as P and B. A metal film such as W, Ta and Al may be formed in place of the polysilicon film 14. Next, photoresists 15a and 15b are formed partially on the upper surface of the polysilicon film 14 by a photolithographic process. The photoresists 15a and 15b are formed over regions in which respective gate electrodes 7a and 7b are to be formed.

Figure 4:
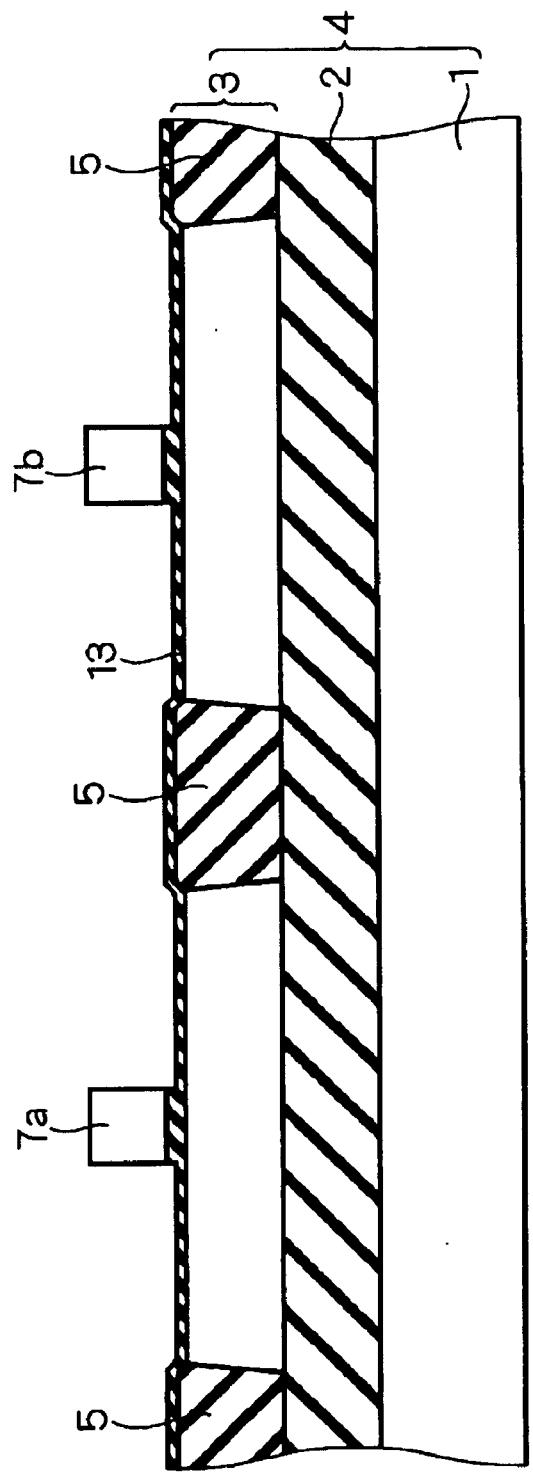

With reference to FIG. 4, using the photoresists 15a and 15b as an etch mask, an anisotropic dry etching process, such as RIE (Reactive Ion Etching) or ECR (Electron Cyclotron Resonance), which exhibits a higher etch rate in a direction of depth of the SOI substrate 4 is performed to etch the polysilicon film 14. This leaves unetched portions of the polysilicon film 14 which lie under the photoresists 15a and 15b to form the gate electrodes 7a and 7b. This anisotropic dry etching process slightly etches the upper surface of the silicon oxide film 13. Thereafter, the photoresists 15a and 15b are removed. The gate electrodes 7a and 7b may be formed by another technique of forming an insulation film on the upper surface of the polysilicon film 14, patterning the insulation film by a photolithographic process and an etching process, and anisotropically etching the polysilicon film 14 using the patterned insulation film as a hard mask.

Figure 5:
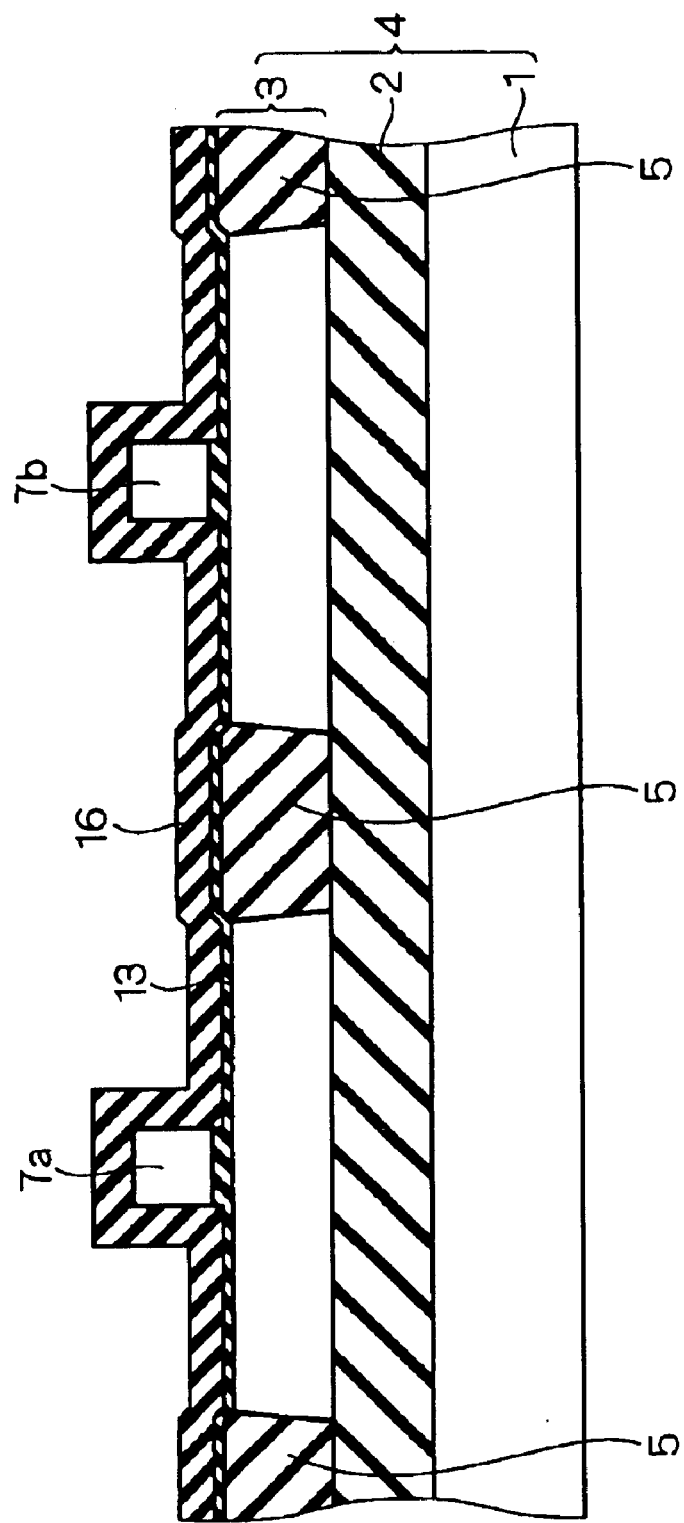

Next, referring to FIG. 5, a silicon oxide film 16 is formed on the entire top surface of the resultant structure by a CVD process or a thermal oxidation process. An HTO film, an LTO film, a TEOS film or a plasma oxide film may be formed in place of the silicon oxide film 16.

Figure 6:
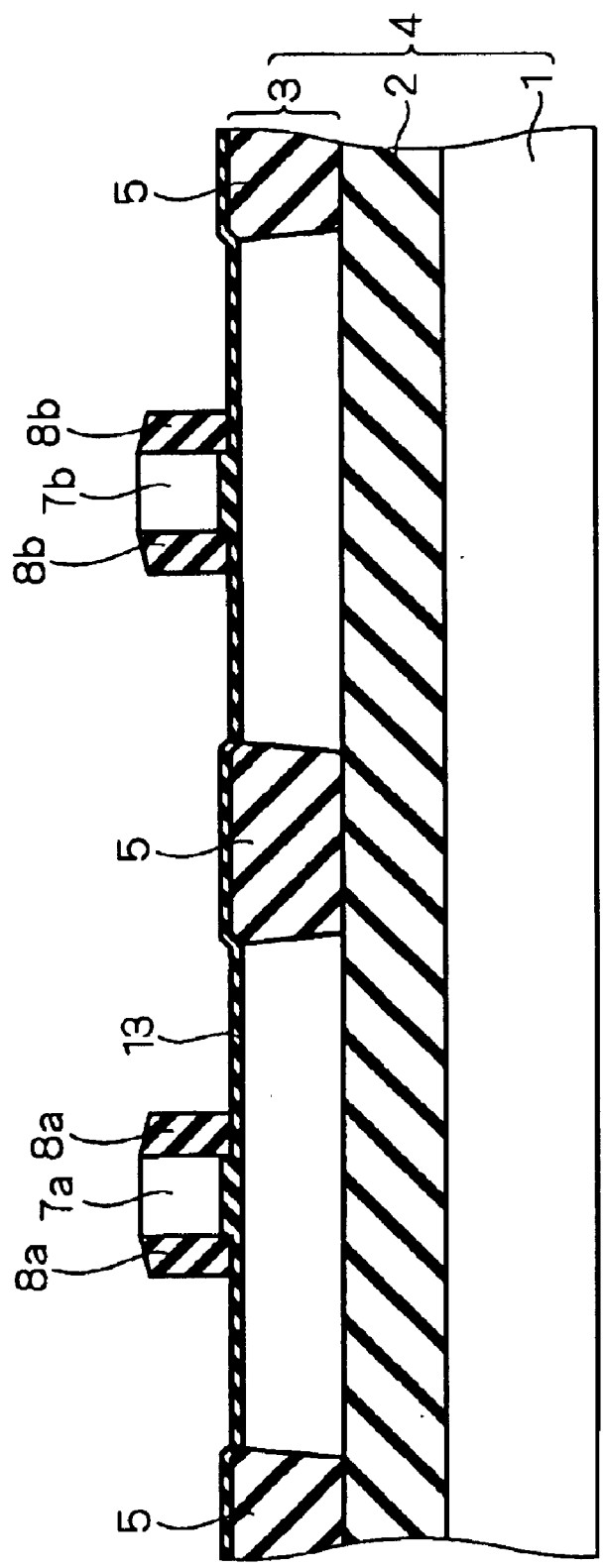

Referring to FIG. 6, the silicon oxide film 16 is etched by an anisotropic dry etching process which exhibits a higher etch rate in the direction of depth of the SOI substrate 4. This forms silicon oxide films 8a and 8b on the side surfaces of the gate electrodes 7a and 7b. In this process, etching may be stopped before the upper surface of the silicon oxide film 13 and the upper surfaces of the gate electrodes 7a and 7b are exposed, so that the silicon oxide film 16 is left thin on the upper surface of the silicon oxide film 13 and the upper surfaces of the gate electrodes 7a and 7b.

Figure 7:
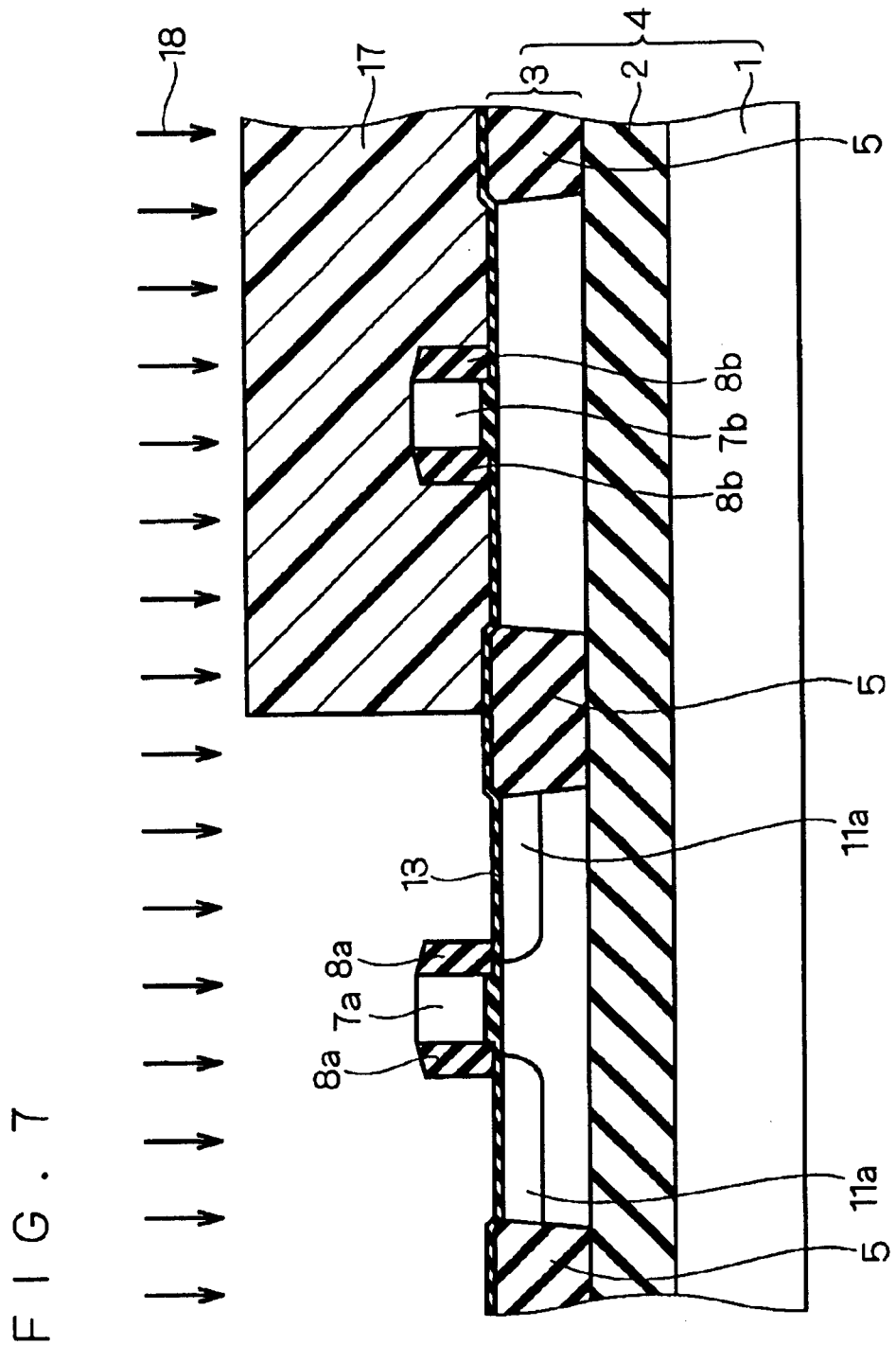

Next, with reference to FIG. 7, a photoresist 17 is formed on a future PMOSFET region by a photolithographic process. Then, using the photoresist 17 as an implant mask, ions of p-type impurity such as B, $BF_2$ and In are implanted under conditions of $1 \times 10^{12}$ to $1 \times 10^{14}$ $cm^{-2}$ to form a pocket region (not shown) in the silicon layer 3 in a future NMOSFET region. The pocket region is formed to suppress a short channel effect resulting from device size reduction. Next, n-type ions 18 such as As, P and Sb are implanted under conditions of $1 \times 10^{13}$ to $1 \times 10^{15}$ $cm^{-2}$ to form extensions 11a in the silicon layer 3 in the future NMOSFET region. In this ion implantation process, the photoresist 17, the gate electrode 7a, the silicon oxide films 8a and the isolating insulation film 5 act as an implant mask. As a result, the extensions 11a are formed in the upper surface of the silicon layer 3 except where the gate electrode 7a, the silicon oxide films 8a and the isolating insulation film 5 are formed, but have respective inner ends (or ends on the gate electrode 7a side) inwardly from the outer side surfaces of the silicon oxide films 8a.

Alternatively, a silicon oxide film having a predetermined thickness may be formed on the entire top surface of the resultant structure by a CVD process before forming the photoresist 17 and after the structure shown in FIG. 6 is provided, thereby to control where to form the pocket region and the extensions 11a in the silicon layer 3. It is not necessary to form the pocket region when suppressing the short channel effect by adjusting a source/drain junction depth, a gate insulation film thickness and the like.

Figure 8:
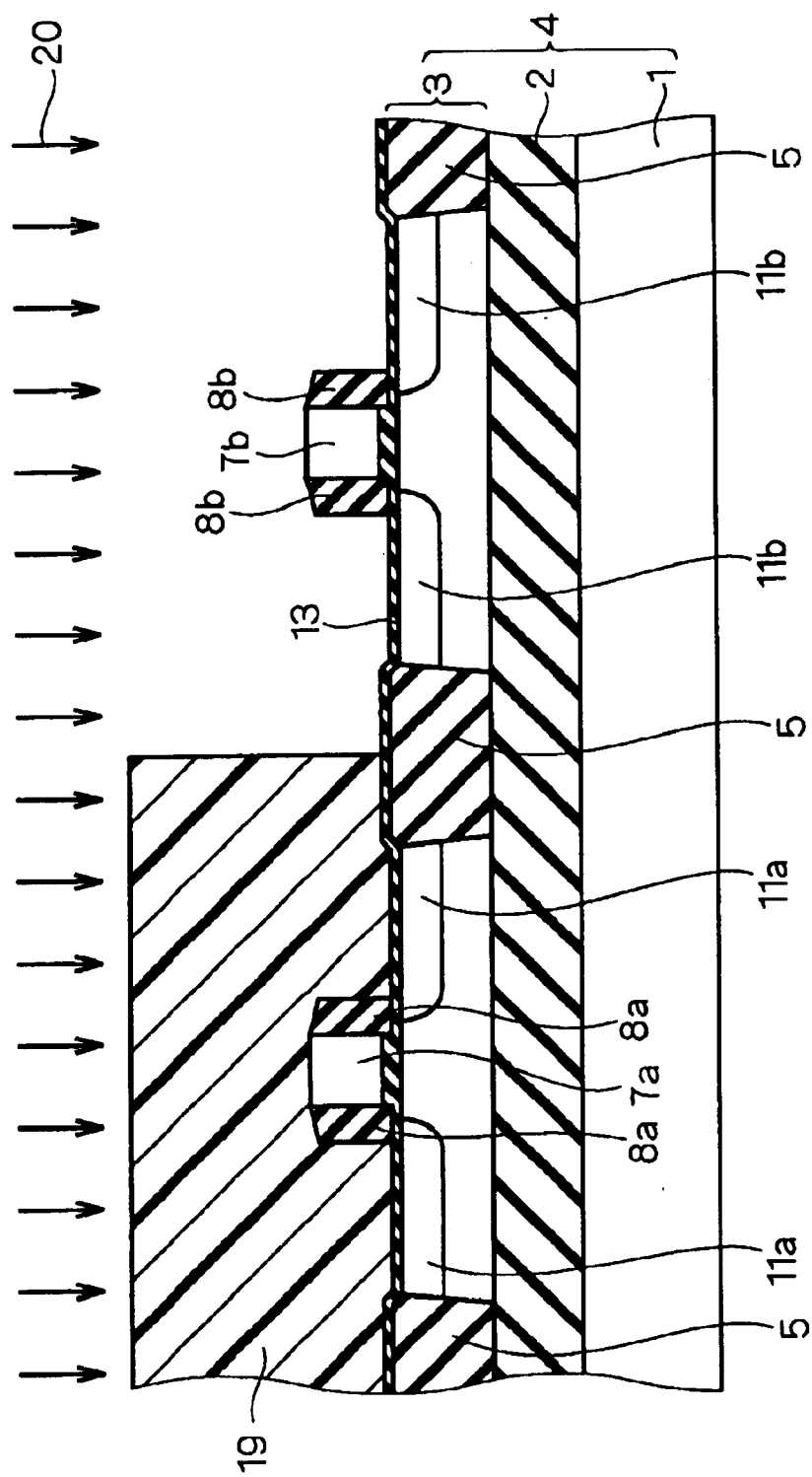

With reference to FIG. 8, after the photoresist 17 is removed, a photoresist 19 is formed on the future NMOSFET region by a photolithographic process. Then, using the photoresist 19 as an implant mask, ions of n-type impurity such as As, P and Sb are implanted under conditions of $1 \times 10^{12}$ to $1 \times 10^{14}$ $cm^{-2}$ to form a pocket region (not shown) in the silicon layer 3 in the future PMOSFET region. Next, p-type ions 20 such as B, $BF_2$ and In are implanted under conditions of $1 \times 10^{12}$ to $1 \times 10^{14}$ $cm^{-2}$ to form extensions 11b in the silicon layer 3 in the future PMOSFET region. In this ion implantation process, the photoresist 19, the gate electrode 7b, the silicon oxide films 8b and the isolating insulation film 5 act as an implant mask. As a result, the extensions 11b are formed in the upper surface of the silicon layer 3 except where the gate electrode 7b, the silicon oxide films 8b and the isolating insulation film 5 are formed, but have respective inner ends (or ends on the gate electrode 7b side) inwardly from the outer side surfaces of the silicon oxide films 8b. As stated above, where to form the pocket region and the extensions 11b in the silicon layer 3 may be controlled. Also, the formation of the pocket region may be dispensed with, as stated above.

Figure 9:
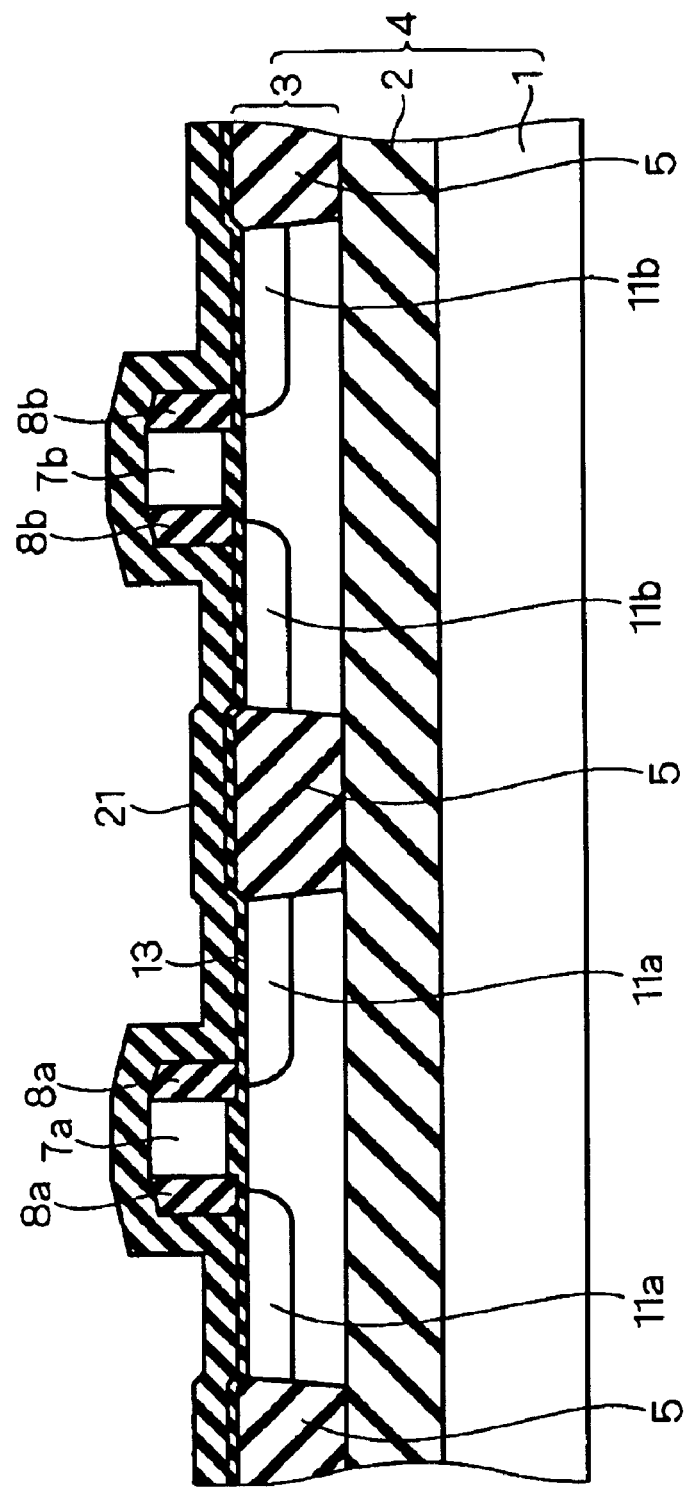
Figure 10:
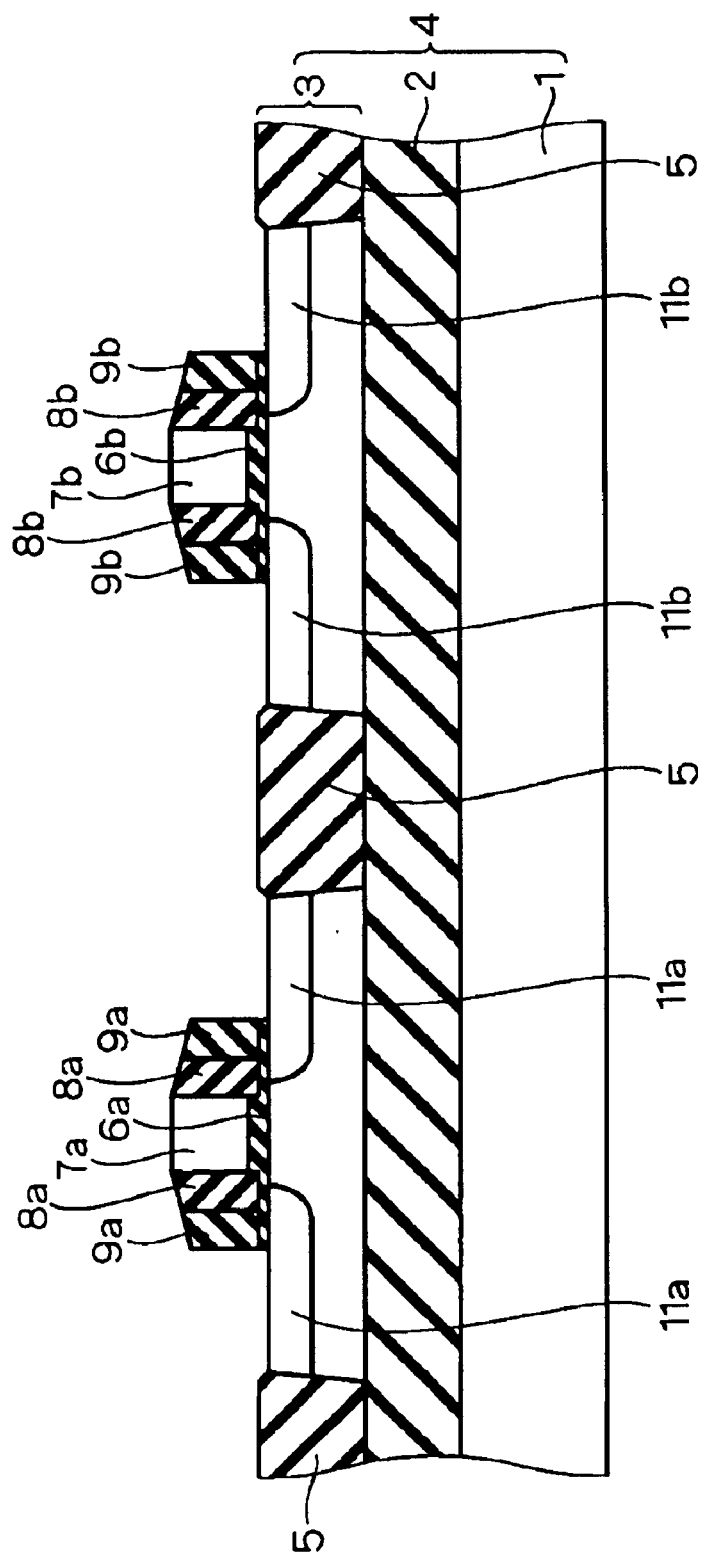

Referring to FIG. 9, after the photoresist 19 is removed, a silicon nitride film 21 is formed on the entire top surface of the resultant structure by a CVD process. With reference to FIG. 10, an anisotropic dry etching process which exhibits a higher etch rate in the direction of depth of the SOI substrate 4 is performed to etch the silicon nitride film 21 and the silicon oxide film 13 in the order named until the upper surface of the silicon layer 3 is exposed. This forms silicon nitride films 9a and 9b serving as sidewall insulation films on the outer side surfaces of the silicon oxide films 8a and 8b. The silicon nitride films 9a and 9b are formed on the silicon oxide films 6a and 6b.

Figure 11:
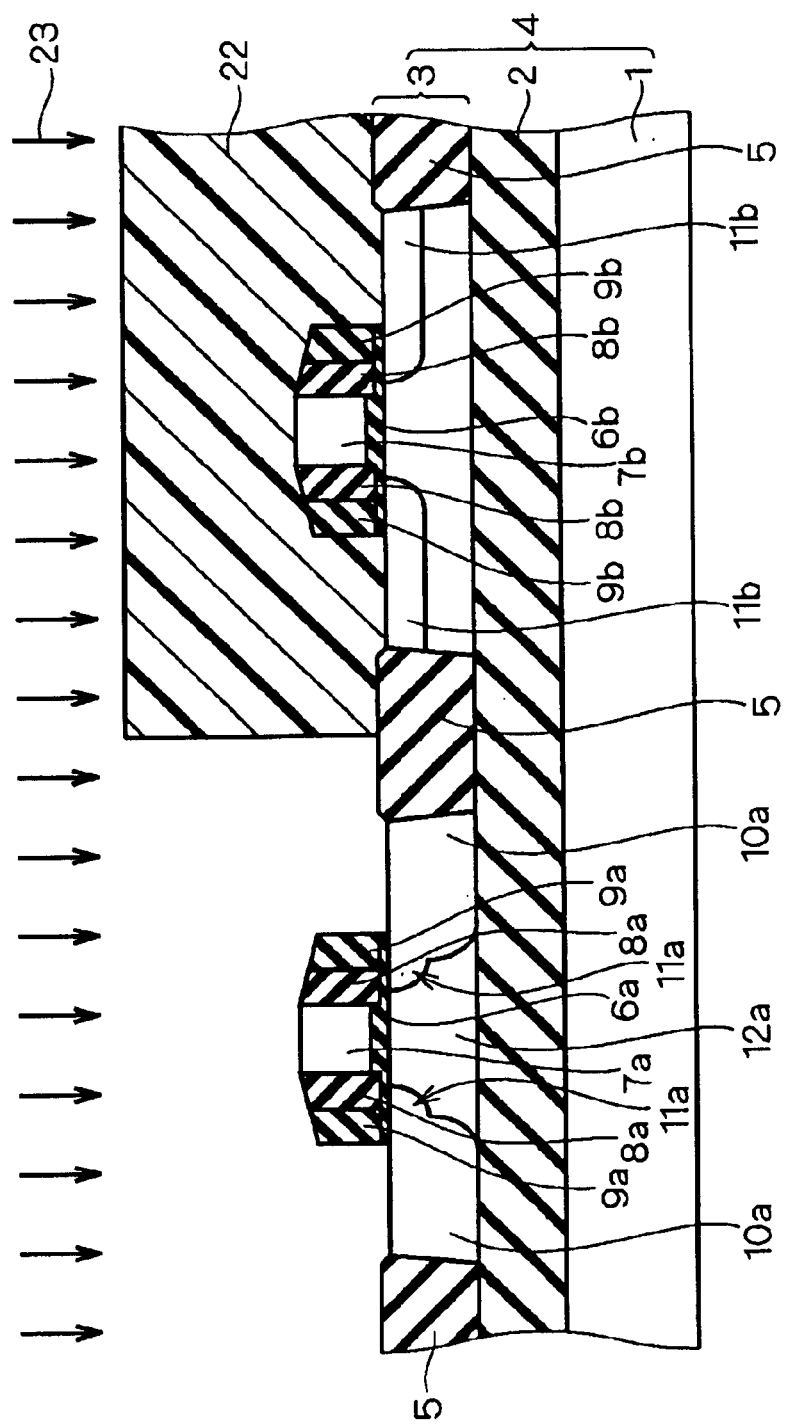

Next, with reference to FIG. 11, a photoresist 22 is formed on the future PMOSFET region by a photolithographic process. Then, using the photoresist 22 as an implant mask, n-type ions 23 such as As, P and Sb are implanted under conditions of $1\times10^{14}$ to $1\times10^{16}$ cm$^{-2}$ to form source/drain regions 10a in the silicon layer 3 in the future NMOSFET region. The extensions 11a become portions of the source/drain regions 10a.

Figure 12:
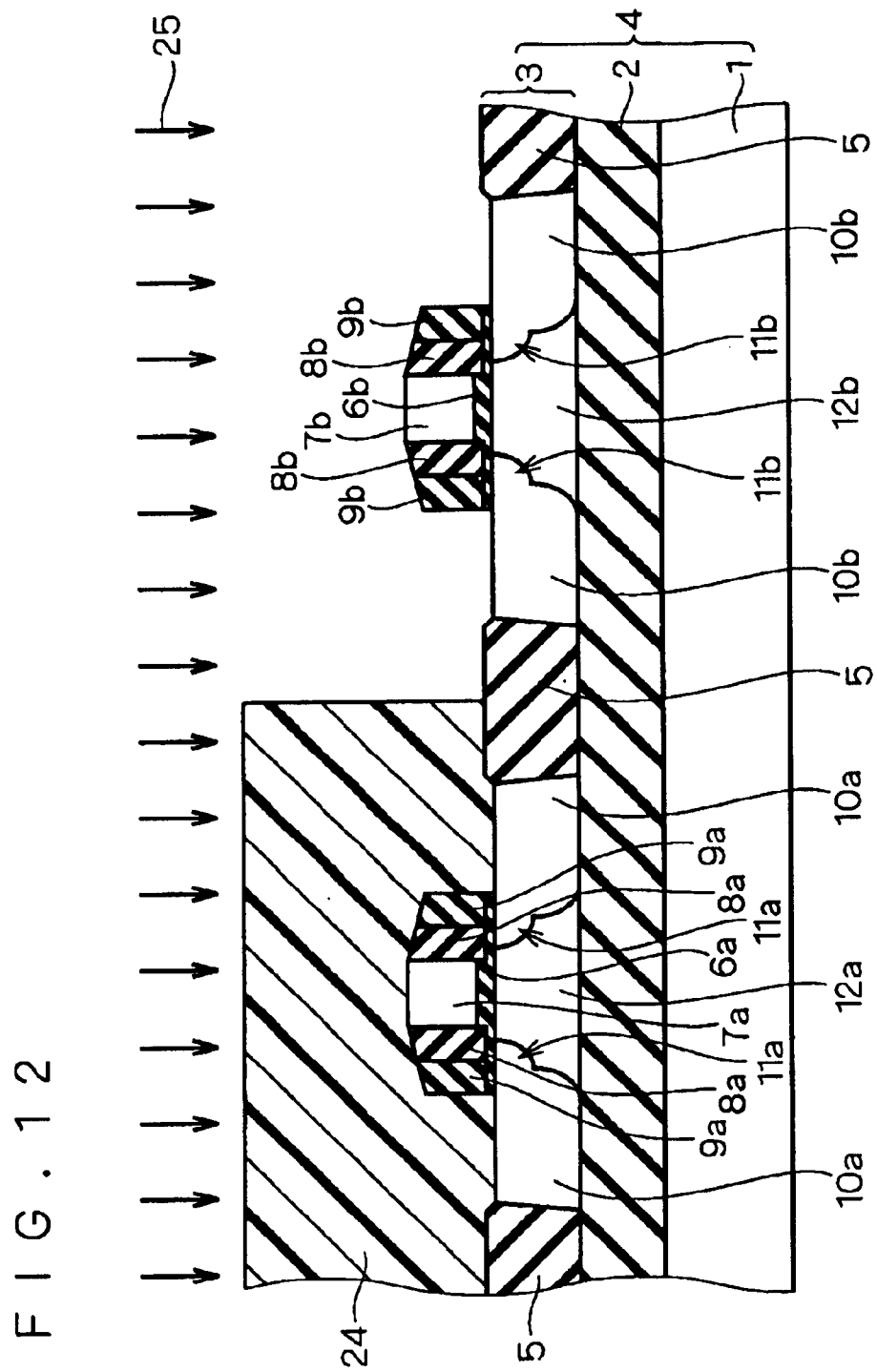

With reference to FIG. 12, after the photoresist 22 is removed, a photoresist 24 is formed on the future NMOSFET region by a photolithographic process. Then, using the photoresist 24 as an implant mask, p-type ions 25 such as B, BF$_2$ and In are implanted under conditions of $1\times10^{14}$ to $1\times10^{16}$ cm$^{-2}$ to form source/drain regions 10b in the silicon layer 3 in the future PMOSFET region. The extensions 11b become portions of the source/drain regions 10b.

Finally, after the photoresist 24 is removed, annealing is performed at about 800 to 1150° C. to activate the impurities introduced into the silicon layer 3. Then, the steps of forming a metal silicide on the upper surfaces of the source/drain regions 10a, 10b and the gate electrodes 7a, 7b and providing interconnections are performed to complete the semiconductor device.

In the method of manufacturing the semiconductor device according to the first preferred embodiment, as discussed above, the extensions 11a and 11b are formed in the steps shown in FIGS. 7 and 8 after the relatively wide silicon oxide films 8a and 8b are formed on the side surfaces of the gate electrodes 7a and 7b in the step shown in FIG. 6. This makes a distance L1 between the pair of source/drain regions 10 (more specifically, between the pair of extensions 11) as shown in FIG. 1 greater than the distance L101 (see FIG. 44) in the background art semiconductor device.

Accordingly increased base width of a parasitic bipolar transistor leads to the reduction in the gain of the parasitic bipolar transistor, thereby suppressing malfunctions and operating characteristic variations of the MOSFET.

Additionally, a reduced overlap between the gate electrode 7 and the extensions 11 as viewed in plan suppresses a gate overlap capacitance to achieve the increase in operating speed and the reduction in power consumption. Moreover, the semiconductor device according to the first preferred embodiment employs the SOI substrate 4, rather than a common bulk substrate. The semiconductor device with the SOI substrate 4 has a lower source/drain junction capacitance since the lower surfaces of the source/drain regions 10 are in contact with the BOX layer 2, as illustrated in FIG. 1. The semiconductor device with the SOI substrate 4 accordingly has a total parasitic capacitance lower than that of the semiconductor device with the bulk substrate. To attain an optimum width of the silicon oxide film 8 for delay time, the method of manufacturing the semiconductor device according to the first preferred embodiment can form the wider silicon oxide films 8 in contact with the side surfaces of the gate electrode 7, as compared with a method of manufacturing the semiconductor device with the bulk substrate. As a result, the method according to the first preferred embodiment effectively prevents the gate electrode 7 from falling down by an ashing process or an RCA cleaning process even if the gate length of the gate electrode 7 is reduced by the device size reduction.

Figure 44:
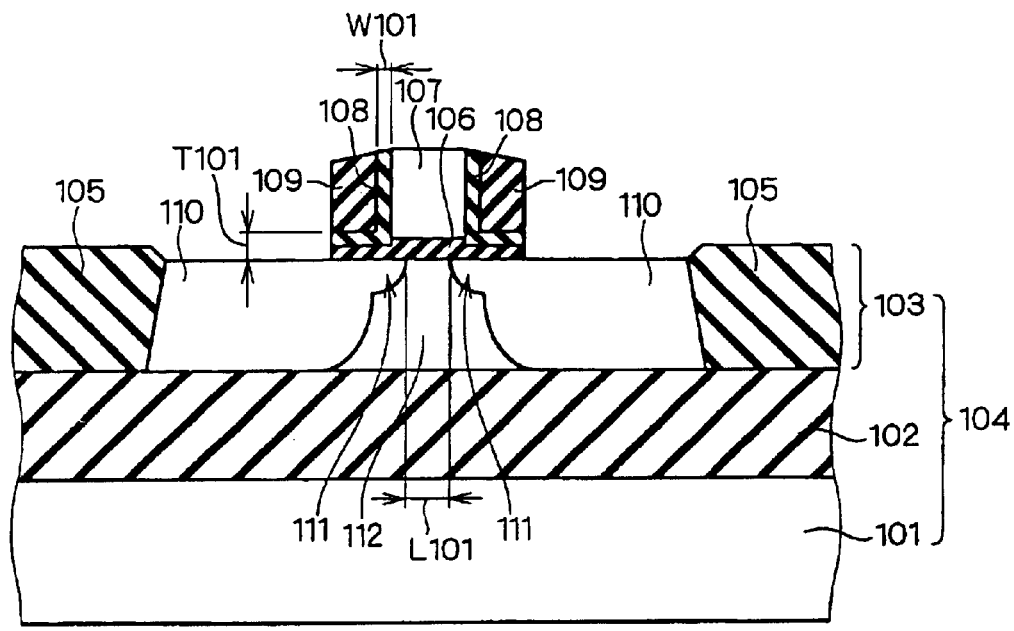
FIG. 44 is a sectional view showing a structure of a background art semiconductor device.
Figure 45:
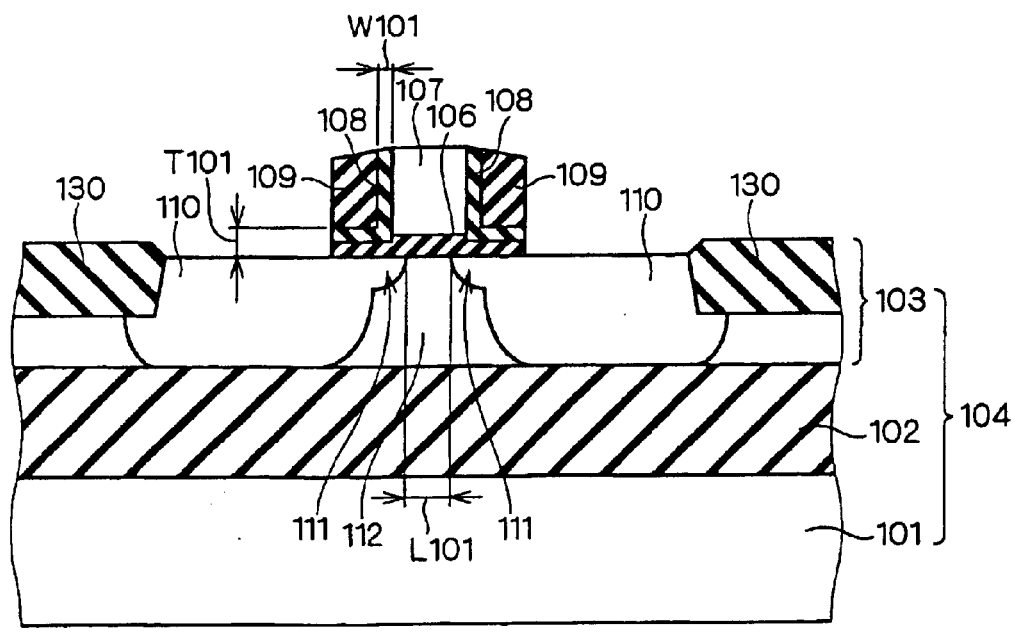
FIG. 45 is a sectional view showing a structure of another background art semiconductor device.

With reference to FIGS. 44 and 45 regarding the background art, simply increasing the thickness of the silicon oxide film 108 increases the distance L101, in which case, however, a higher implant energy is required in the step of ion implantation for the formation of the extensions 111. Accordingly, the greater range of ions makes it difficult to form the shallow extensions 111 in the upper surface of the silicon layer 103, resulting in the occurrence of the short channel effect. On the other hand, the method according to the first preferred embodiment can form the shallow extensions 11 in the upper surface of the silicon layer 3 to suppress the short channel effect.

Second Preferred Embodiment

Figure 13:
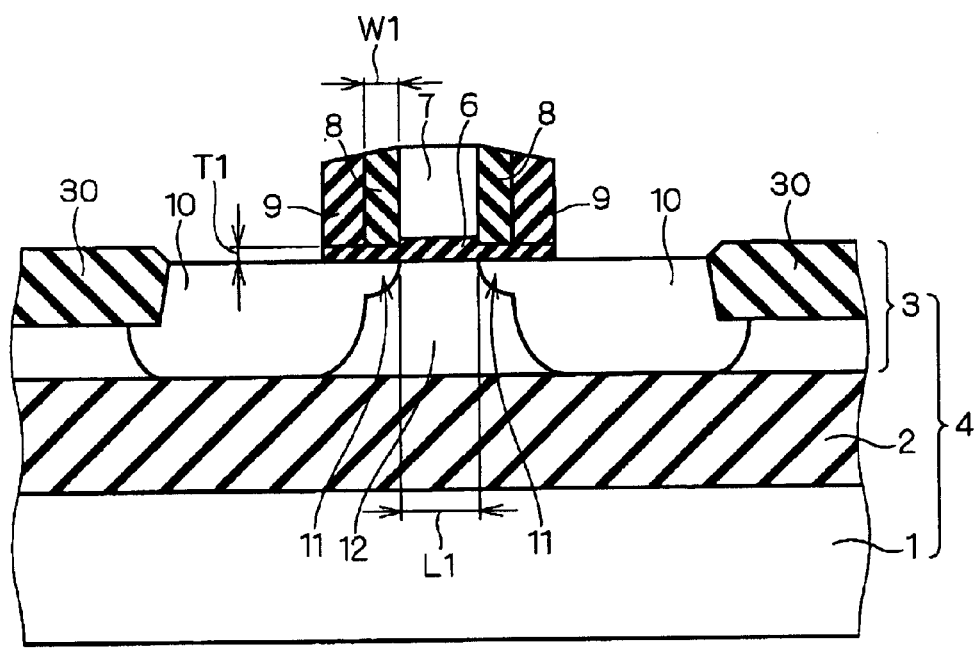
FIG. 13 is a sectional view showing a structure of a semiconductor device according to a second preferred embodiment of the present invention.

FIG. 13 is a sectional view showing a structure of a semiconductor device according to a second preferred embodiment of the present invention. The semiconductor device shown in FIG. 13 has a partially isolating insulation film 30 in place of the completely isolating insulation film 5 shown in FIG. 1. The remaining structure of the semiconductor device according to the second preferred embodiment is similar to the corresponding structure of the above-stated semiconductor device according to the first preferred embodiment shown in FIG. 1. The semiconductor device according to the second preferred embodiment may be manufactured by performing the steps shown in FIGS. 3 through 12 except that the isolating insulation film 30 is formed in place of the isolating insulation film 5 in the step shown in FIG. 3.

The use of the partially isolating insulation film 30 allows the body region 12 to be tied to a fixed potential through a portion of the silicon layer 3 which lies between the lower surface of the isolating insulation film 30 and the upper surface of the BOX layer 2 from a body contact region (not shown). This suppresses a so-called floating body effect such as the occurrence of a kink effect and variations in delay time depending on an operating frequency.

The semiconductor device according to the second preferred embodiment produces effects to be described below in addition to the effects produced by the semiconductor device and the method of manufacturing the same according to the first preferred embodiment. The increased distance L1 results in a decreased body resistance in a vertical direction as viewed in FIG. 13. This reduces a problem such that the threshold voltage of the MOSFET differs depending on the distance from the body contact region.

Figure 14:
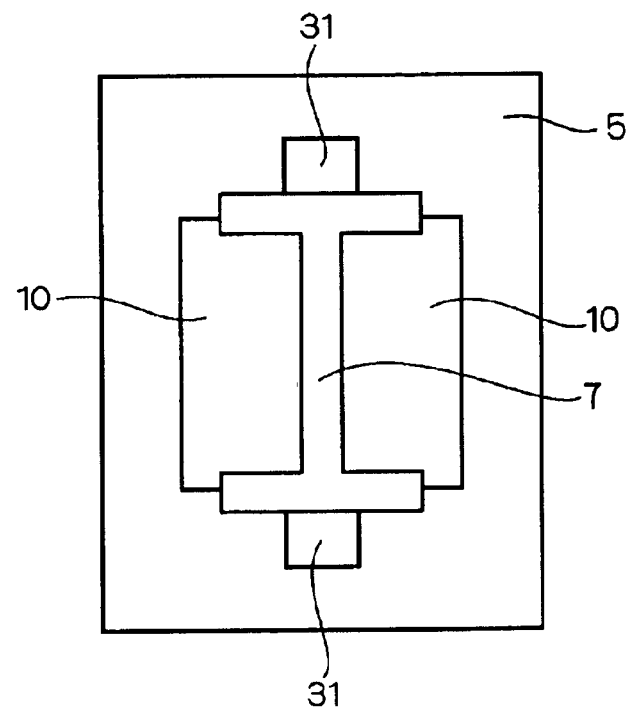
FIG. 14 is a top plan view showing a first modification of the semiconductor device according to the second preferred embodiment.

FIG. 14 is a top plan view showing a first modification of the semiconductor device according to the second preferred embodiment. The semiconductor device shown in FIG. 14 employs the completely isolating insulation film 5, rather than the partially isolating insulation film 30. The gate electrode 7 used in this modification is an H-shaped gate having a central portion with wider opposite end portions. To fix the potential of the body region 12, a pair of body contact regions 31 in direct contact with the body region 12 are formed at the respective end portions of the gate electrode 7.

Figure 15:
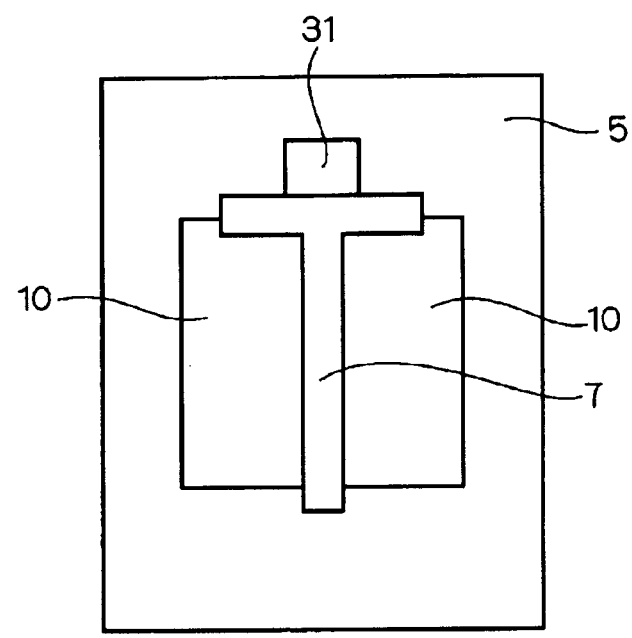
FIG. 15 is a top plan view showing a second modification of the semiconductor device according to the second preferred embodiment.

FIG. 15 is a top plan view showing a second modification of the semiconductor device according to the second preferred embodiment. The semiconductor device shown in FIG. 15 employs the completely isolating insulation film 5, rather than the partially isolating insulation film 30. The gate electrode 7 used in this modification is a T-shaped gate having a central portion with one wider end portion. To fix the potential of the body region 12, a body contact region 31 in direct contact with the body region 12 is formed at the one wider end portion of the gate electrode 7.

The semiconductor devices shown in FIGS. 14 and 15 may employ the cross-sectional structure shown in FIG. 13 to reduce the body resistance, thereby reducing the problem such that the threshold voltage of the MOSFET differs depending on the distance from the body contact region(s) 31.

Third Preferred Embodiment

A third preferred embodiment according to the present invention will describe a relationship between the gate length of the gate electrode 7 and the width W1 of the silicon oxide film 8 in the direction of the gate length.

Figure 16:
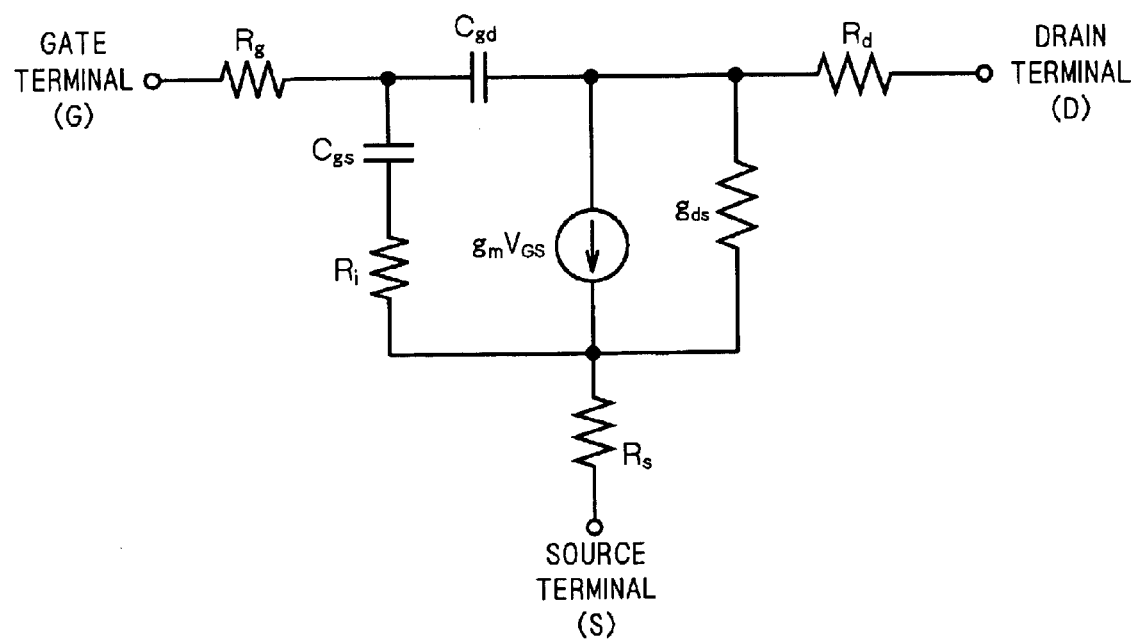
FIG. 16 is a circuit diagram showing an equivalent circuit of a transistor in a simplified form according to a third preferred embodiment of the present invention.

FIG. 16 is a circuit diagram showing an equivalent circuit of a transistor in a simplified form. In FIG. 16, $R_g$ denotes a gate resistance; $R_i$ denotes a channel resistance; $R_s$ denotes a source resistance; $g_m$ denotes a mutual conductance; $g_{ds}$ denotes a drain-source conductance; $C_{gs}$ denotes a gate-source capacitance; and $C_{gd}$ denotes a gate-drain capacitance. In general, a cutoff frequency $f_t$ and a maximum oscillation frequency $f_{max}$ are measures of the performance of a transistor. With reference to FIG. 16, the cutoff frequency $f_t$ and the maximum oscillation frequency $f_{max}$ are expressed respectively by $$f_t = \frac{g_m}{2\pi C_{gs}} \text{ and} \tag{1}$$

$$f_{max} = \frac{f_t}{2\sqrt{g_{ds}(R_g + R_s + R_i) + 2\pi f_t R_g C_{gd}}} \tag{2}$$

As the width W1 of the silicon oxide film 8 is increased, the mutual conductance $g_m$ decreases because of an increased effective channel length. From Equation (1), increasing the width W1 of the silicon oxide film 8 decreases the cutoff frequency $f_t$. From Equation (2), decreasing the cutoff frequency $f_t$ also decreases the maximum oscillation frequency $f_{max}$. However, as the width W1 of the silicon oxide film 8 is increased, a gate-drain overlap capacitance (corresponding to the above capacitance $C_{gd}$) decreases, and the drain-source conductance $g_{ds}$ also decreases because of the suppressed short channel effect. Thus, there is a trade-off between the cutoff frequency $f_t$, and the gate-drain overlap capacitance $C_{gd}$ and drain-source conductance $g_{ds}$. Therefore, an optimum value for the width W1 of the silicon oxide film 8 exits to improve the maximum oscillation frequency $f_{max}$.

Figure 17:
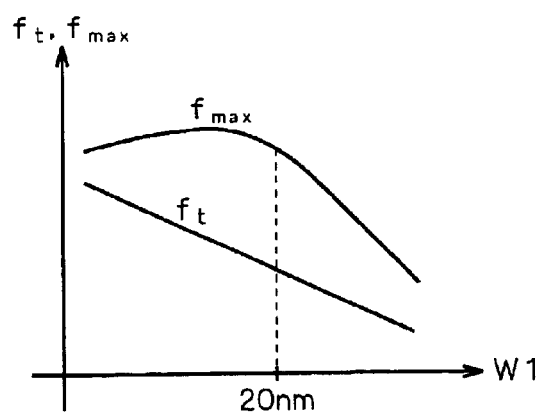
FIG. 17 is a graph of a silicon oxide film width versus a cutoff frequency and a maximum oscillation frequency as a result of measurements made on a transistor having a gate length of 70 nm.

FIG. 17 is a graph of the width W1 of the silicon oxide film 8 versus the cutoff frequency $f_t$ and maximum oscillation frequency $f_{max}$ as a result of measurements made on a transistor having a gate length Lg=70 nm. To prevent the gate electrode 7 from falling down by an ashing process or an RCA cleaning process, it is desirable that the width W1 of the silicon oxide film 8 is greater. However, as the width W1 of the silicon oxide film 8 is too great, the maximum oscillation frequency $f_{max}$ decreases, as illustrated in FIG. 17. It is hence desirable to set the width W1 of the silicon oxide film 8 at about 20 nm in the light of the stable formation of the gate electrode 7 and the suppression of the decrease in the maximum oscillation frequency $f_{max}$. In this case, the ratio of the gate length Lg to the width W1 of the silicon oxide film 8 is 1 to 2/7.

Next, consideration will be given to a situation in which the gate electrode 7 is reduced in size. In accordance with the scaling law, as the gate length Lg decreases with further size reduction, the width W1 of the silicon oxide film 8 should decrease accordingly. However, the ion implantation for the formation of the extensions 11 uses sub-keV implant energy at present, and it is difficult to further decrease the implant energy. For heat treatment, RTA (Rapid Thermal Annealing) techniques are currently used, and it is also difficult to further shorten the time for heat treatment. For these reasons, difficulties lie in forming the shallow source/drain regions 10 in accordance with the scaling law even if the gate electrode 7 is reduced in size, and a source/drain profile is not considered to change so greatly. Further, decreasing the width W1 of the silicon oxide film 8 in accordance with the scaling law increases the gate overlap capacitance to slow down the operating speed of the transistor. For the above-mentioned reasons, the optimum value for the width W1 of the silicon oxide film 8 is considered to remain at 20 nm even if the device size is further reduced. Therefore, even in the case of the size reduction to the shortest gate length (Lg=20 nm) which allows the MOS transistor to operate, the optimum value for the width W1 of the silicon oxide film 8 is about 20 nm, in which case the ratio of the gate length Lg to the width W1 of the silicon oxide film 8 is 1 to 1.

Thus, the semiconductor device according to the third preferred embodiment, in which the width W1 of the silicon oxide film 8 is set in the range of 2/7 to 1 times the gate length Lg of the gate electrode 7, can achieve the stable formation of the gate electrode 7 and suppress the reduction in the maximum oscillation frequency $f_{max}$.

Fourth Preferred Embodiment

Figure 18:
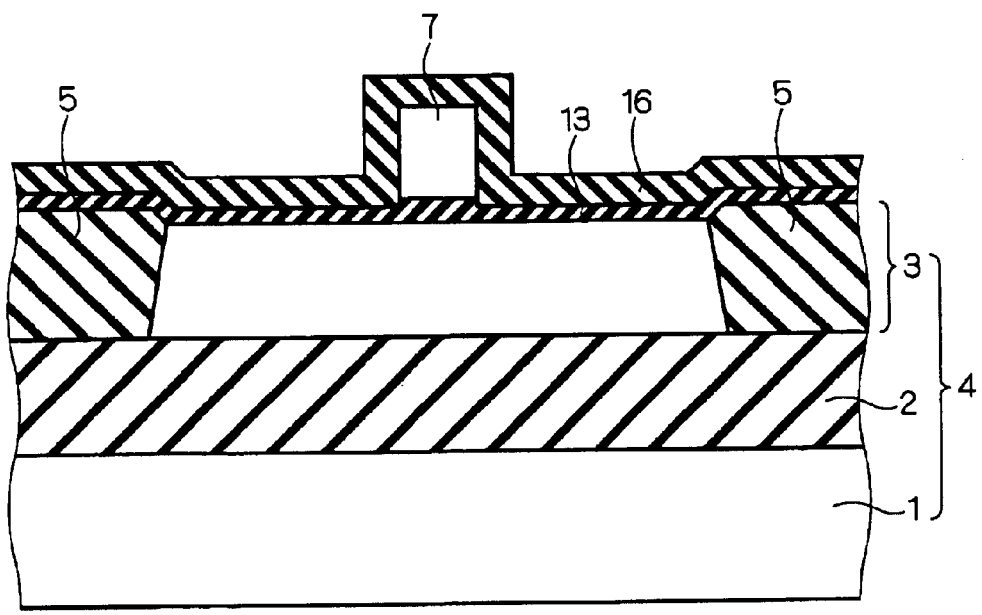
FIGS. 18 through 22 are sectional views showing a method of manufacturing a semiconductor device in a step-by-step manner according to a fourth preferred embodiment of the present invention.

FIGS. 18 through 22 are sectional views showing a method of manufacturing a semiconductor device in a step-by-step manner according to a fourth preferred embodiment of the present invention. Referring first to FIG. 18, the gate electrode 7 is formed by the process described in the first preferred embodiment, and thereafter the silicon oxide film 16 is formed on the entire top surface of the resultant structure by a CVD process.

Figure 19:
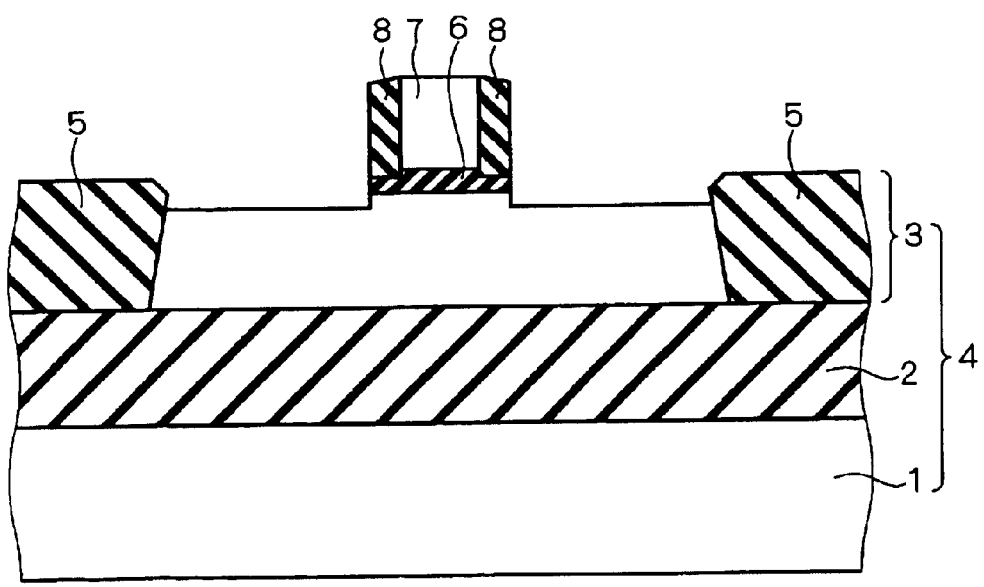

Referring to FIG. 19, the silicon oxide film 16 is etched by an anisotropic dry etching process which exhibits a higher etch rate in the direction of depth of the SOI substrate 4. This forms the silicon oxide films 8 on the side surfaces of the gate electrode 7. The anisotropic dry etching process for formation of the silicon oxide films 8 is continued to overetch the upper surface of the silicon layer 3 exposed by the etching of the silicon oxide film 16. The etching causes damages to create defects in the upper surface of the silicon layer 3.

Figure 20:
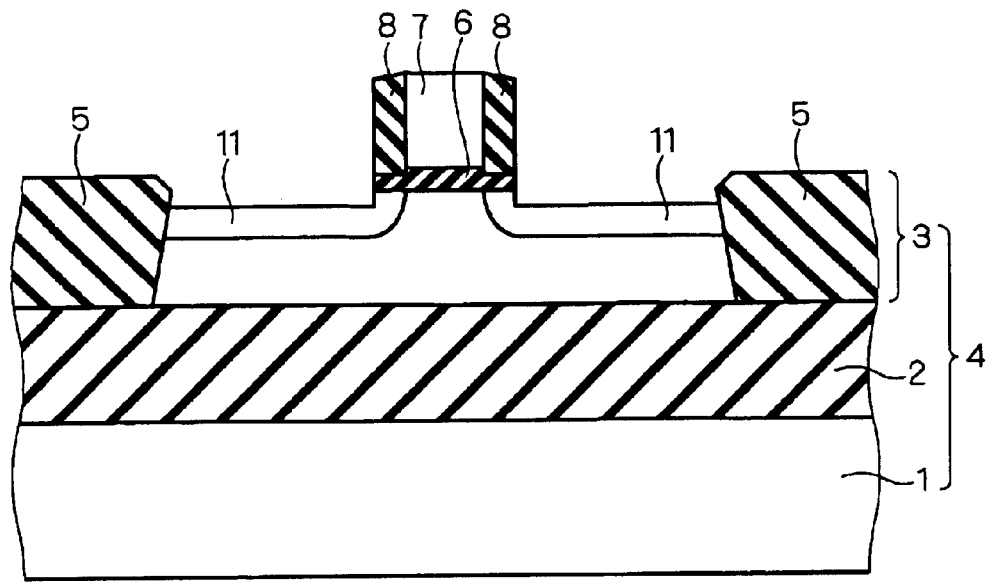
Figure 21:
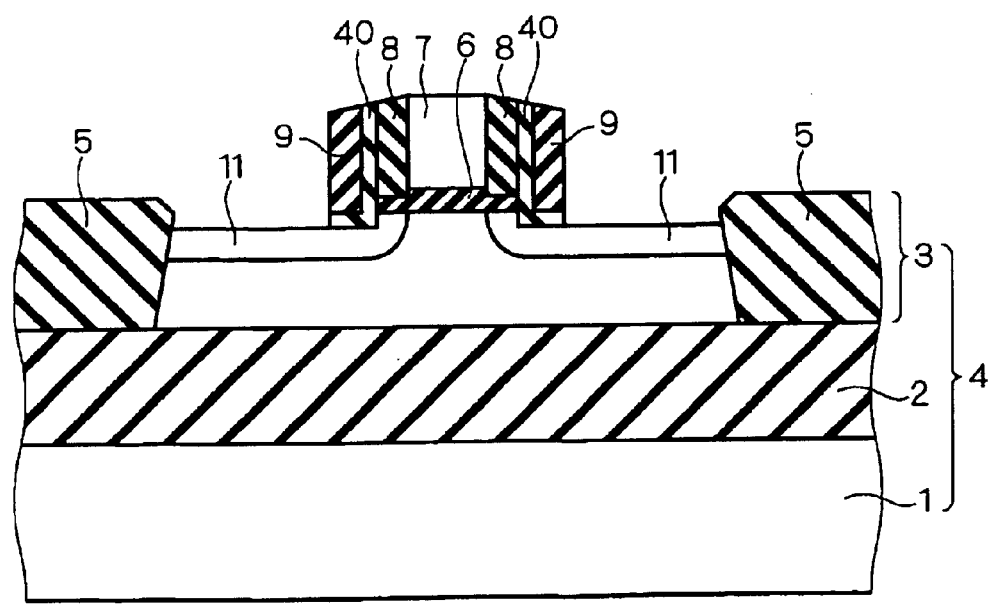
Figure 22:
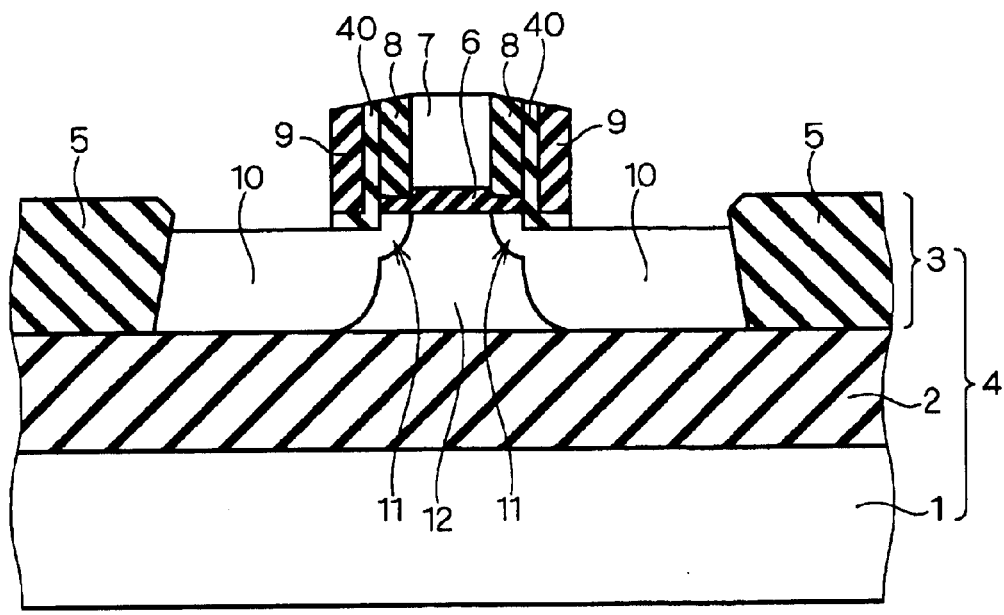

With reference to FIG. 20, the extensions 11 are formed in the upper surface of the silicon layer 3 by an ion implantation process. Referring to FIG. 21, a silicon oxide film and a silicon nitride film are formed in the order named on the entire top surface of the resultant structure by a CVD process. Next, an anisotropic dry etching process which exhibits a higher etch rate in the direction of depth of the SOI substrate 4 is performed to etch the silicon oxide film and the silicon nitride film until the upper surface of the silicon layer 3 is exposed. This forms silicon oxide films 40 and the silicon nitride films 9 on the outer side surfaces of the silicon oxide films 8. Referring to FIG. 22, the source/drain regions 10 are formed in the silicon layer 3 by an ion implantation process.

In the method of manufacturing the semiconductor device according to the fourth preferred embodiment, as discussed above, the etching process for the formation of the silicon oxide films 8 etches the upper surface of the silicon layer 3 as well to create defects in the upper surface of the silicon layer 3. As a result, the defects act as lifetime killers for the parasitic bipolar transistor to reduce the gain of the parasitic bipolar transistor. The technique of the fourth preferred embodiment is applicable to any one of the first to third preferred embodiments.

Figure 23:
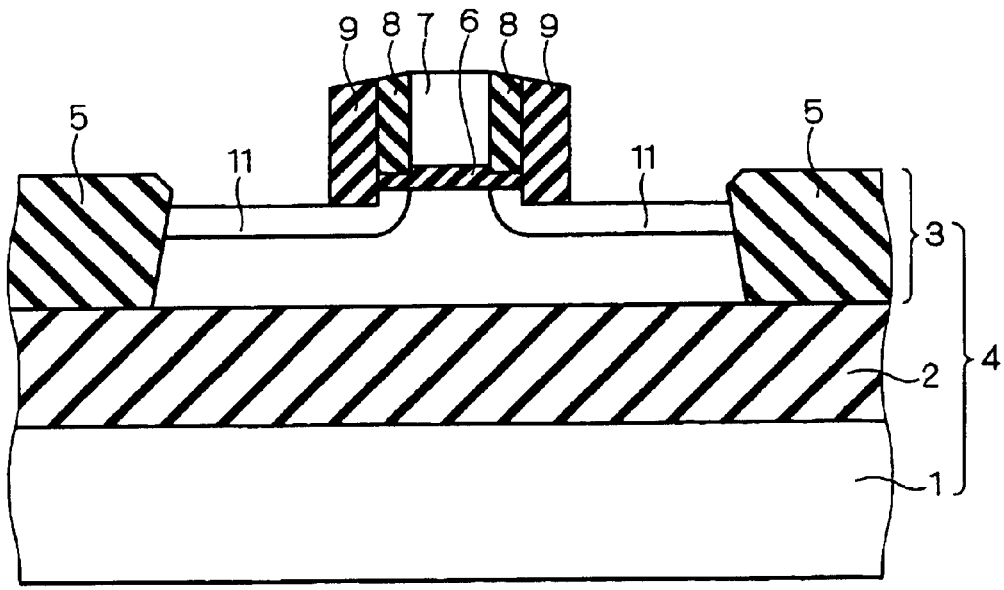
FIG. 23 is a sectional view showing a first modification of the method of manufacturing the semiconductor device according to the fourth preferred embodiment.

FIG. 23 is a sectional view showing a first modification of the method of manufacturing the semiconductor device according to the fourth preferred embodiment. The silicon nitride films 9 shown in FIG. 21 are formed on the upper surface of the silicon layer 3, with the silicon oxide films 40 therebetween. In the first modification of the fourth preferred embodiment, on the other hand, the silicon nitride films 9 are formed directly on the upper surface of the silicon layer 3. The technique of the first modification of the fourth preferred embodiment is applicable to any one of the first to fourth preferred embodiments.

In the first modification of the fourth preferred embodiment, stresses caused at an interface between the lower surface of the silicon nitride films 9 and the upper surface of the silicon layer 3 create more lifetime killers in the upper surface of the silicon layer 3, to further reduce the gain of the parasitic bipolar transistor. This suppresses the floating body effect which is a problem with SOI devices. Suppression of the floating body effect brings about the advantages of suppressing a transient effect, the kink effect and a hot carrier effect and improving the current driving capability.

Figure 24:
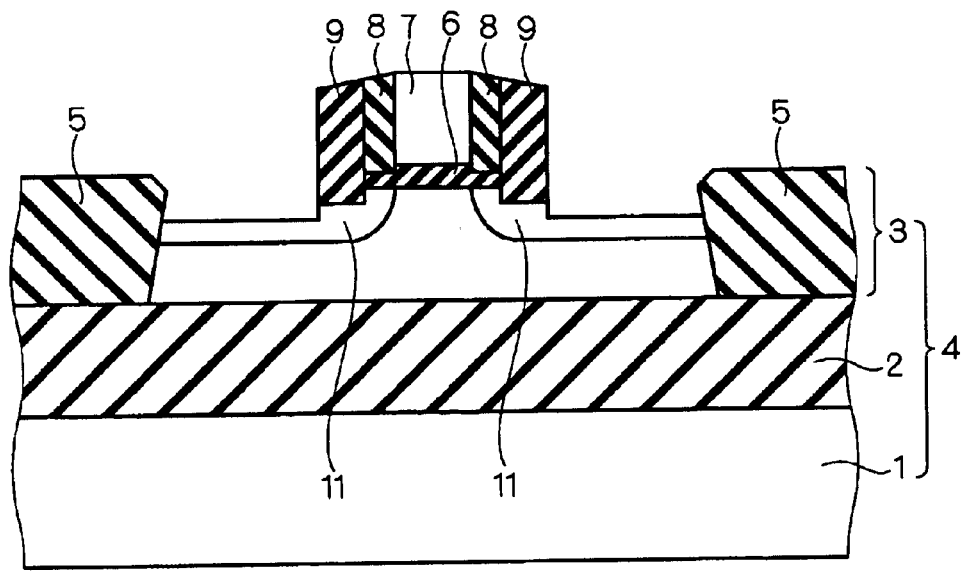
FIG. 24 is a sectional view showing a second modification of the method of manufacturing the semiconductor device according to the fourth preferred embodiment.

FIG. 24 is a sectional view showing a second modification of the method of manufacturing the semiconductor device according to the fourth preferred embodiment. The anisotropic dry etching process for the formation of the silicon nitride films 9 in the technique shown in FIGS. 22 and 23 is stopped when the upper surface of the silicon layer 3 is exposed. In the second modification of the fourth preferred embodiment, on the other hand, the anisotropic dry etching process for the formation of the silicon nitride films 9 overetches the upper surface of the silicon layer 3 as well. The technique of the second modification of the fourth preferred embodiment is applicable to any one of the first to fourth preferred embodiments and the first modification of the fourth preferred embodiment.

In the second modification of the fourth preferred embodiment, etching the upper surface of the silicon layer 3 as well when forming the silicon nitride films 9 creates more lifetime killers in the upper surface of the silicon layer 3, to further reduce the gain of the parasitic bipolar transistor.

Figure 25:
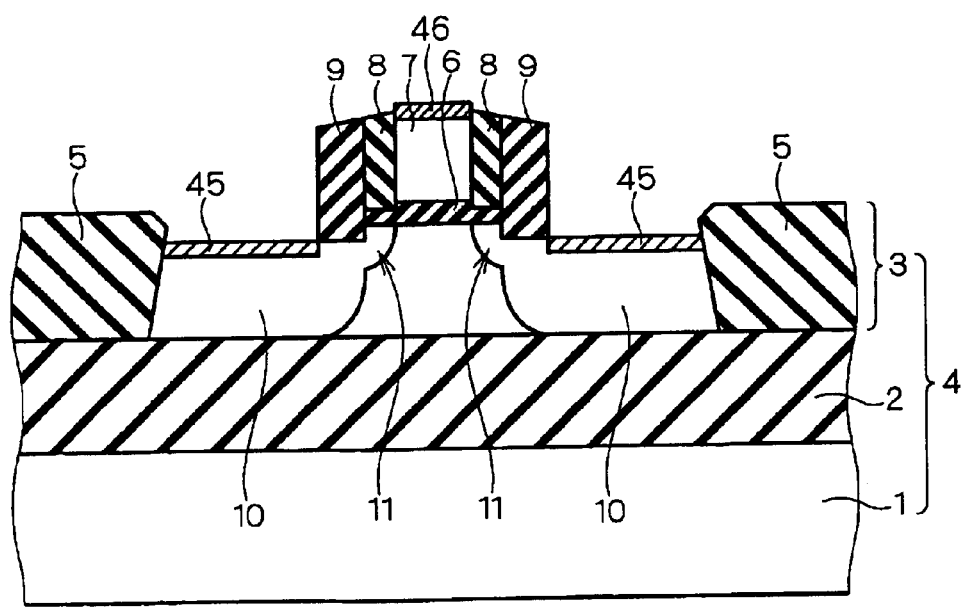
FIG. 25 is a sectional view showing a third modification of the method of manufacturing the semiconductor device according to the fourth preferred embodiment.

FIG. 25 is a sectional view showing a third modification of the method of manufacturing the semiconductor device according to the fourth preferred embodiment. In the third modification of the fourth preferred embodiment, after the source/drain regions 10 are formed in the silicon layer 3, metal silicide layers 45 are formed by silicidation of the upper surface of the source/drain regions 10. This silicidation process causes silicidation of the upper surface of the gate electrode 7 as well to form a metal silicide layer 46. The technique of the third modification of the fourth preferred embodiment is applicable to any one of the first to fourth preferred embodiments and the first and second modifications of the fourth preferred embodiment.

In the third modification of the fourth preferred embodiment, the silicidation of the upper surface of the source/drain regions 10 creates more lifetime killers in the upper surface of the silicon layer 3, to further reduce the gain of the parasitic bipolar transistor.

The first to third modifications of the fourth preferred embodiment are intended to create a large number of lifetime killers in the upper surface of the silicon layer 3 to reduce the gain of the parasitic bipolar transistor. The increase in the number of lifetime killers, however, has the drawback of increasing junction leakage. It is, hence, necessary to select an optimum structure in consideration for both the advantage of increasing the operating speed by suppressing the floating body effect and the drawback of increasing power consumption resulting from the increase in junction leakage.

Fifth Preferred Embodiment

In the semiconductor device according to the first preferred embodiment shown in FIG. 2, the width of the silicon oxide films 8a of the NMOSFET is equal to the width of the silicon oxide films 8b of the PMOSFET. A semiconductor device with these widths different from each other depending on purposes will be described according to a fifth preferred embodiment of the present invention.

Figure 26:
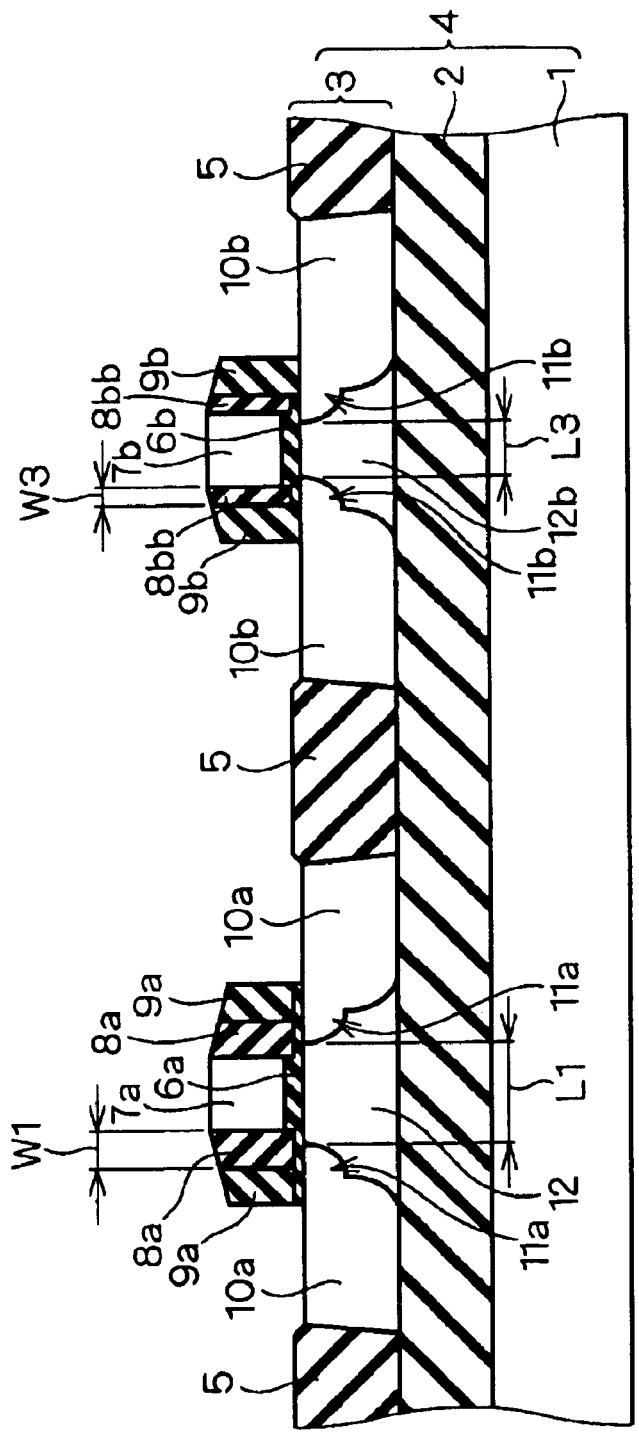
FIG. 26 is a sectional view showing a structure of a semiconductor device according to a fifth preferred embodiment of the present invention.

FIG. 26 is a sectional view showing a structure of a semiconductor device according to the fifth preferred embodiment of the present invention. The structure shown in FIG. 26 includes, in place of the silicon oxide films 8b shown in FIG. 2, silicon oxide films 8bb having a width W3 less than the width W1 of the silicon oxide films 8a. A distance L3 between the pair of source/drain regions 10b is accordingly shorter than the distance L1 between the pair of source/drain regions 10a. The silicon oxide films 8bb having the smaller width may be produced, for example, by wet etching the silicon oxide films 8b in the step shown in FIG. 8.

Figure 27:
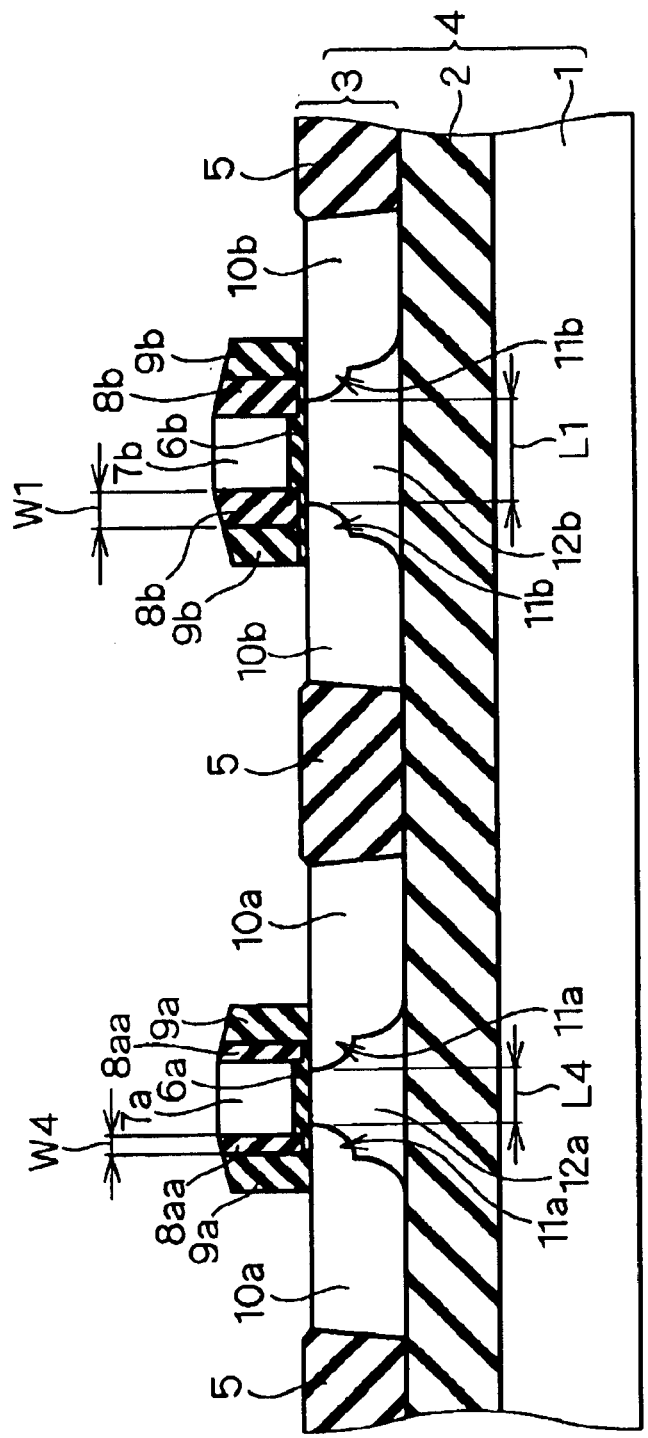
FIG. 27 is a sectional view showing a structure of another semiconductor device according to the fifth preferred embodiment of the present invention.

FIG. 27 is a sectional view showing a structure of another semiconductor device according to the fifth preferred embodiment of the present invention. The structure shown in FIG. 27 includes, in place of the silicon oxide films 8a shown in FIG. 2, silicon oxide films 8aa having a width W4 less than the width W1 of the silicon oxide films 8b. A distance L4 between the pair of source/drain regions 10a is accordingly shorter than the distance L1 between the pair of source/drain regions 10b. The silicon oxide films 8aa having the smaller width may be produced, for example, by wet etching the silicon oxide films 8a in the step shown in FIG. 7.

The problem of the floating body effect is more prone to occur in the NMOSFET than in the PMOSFET since the parasitic bipolar transistor is easily operated by holes generated by impact ionization near the drain in the NMOSFET. Therefore, making the width of the silicon oxide films 8a of the NMOSFET greater than that of the silicon oxide films 8bb of the PMOSFET as in the semiconductor device shown in FIG. 26 reduces the problem of the floating body effect in the NMOSFET to improve the operating speed and the current driving capability.

The short channel effect is more prone to occur in the PMOSFET than in the NMOSFET. Therefore, making the width of the silicon oxide films 8b of the PMOSFET greater than that of the silicon oxide films 8aa of the NMOSFET as in the semiconductor device shown in FIG. 27 suppresses the occurrence of the short channel effect in the PMOSFET. This improves the roll-off characteristic of the PMOSFET to suppress the increase in off-state current, thereby achieving the reduction in power consumption.

Sixth Preferred Embodiment

The relationship between the width W1 of the silicon oxide film 8 serving as an offset insulation film, and the cutoff frequency $f_t$ and maximum oscillation frequency $f_{max}$ is illustrated in FIG. 17. The cutoff frequency $f_t$ and maximum oscillation frequency $f_{max}$ are used as an indicator which indicates the performance of analog circuits and radio-frequency circuits, although the analog circuits will be typically described hereinafter. Examples of the analog circuits include a PLL (phase-locked loop) circuit and a sense amplifier. On the other hand, an inverter delay time $t_{pd}$ is often used as a measure of the performance of digital circuits. The delay time $t_{pd}$ is expressed as $$t_{pd} = \frac{CV_{DD}}{I} \quad (3)$$

where C is a total capacitance, $V_{DD}$ is a power supply voltage, and I is the current driving capability.

Figure 28:
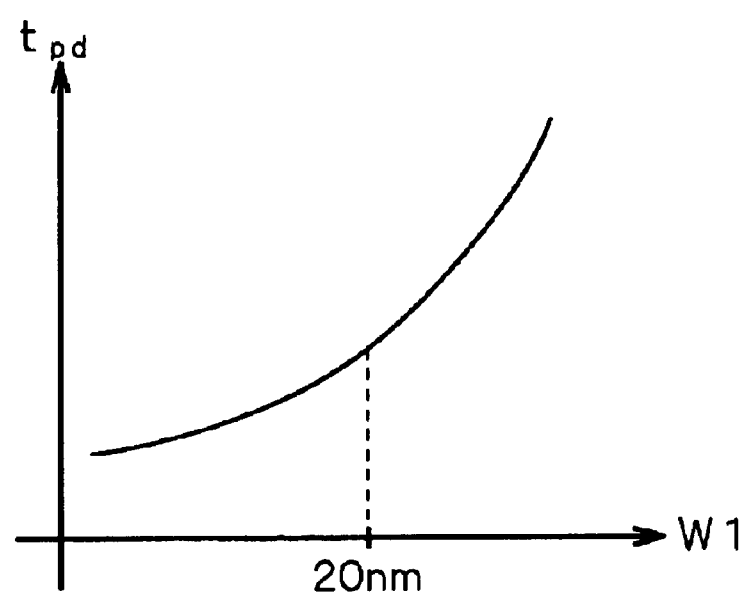
FIG. 28 is a graph of an offset insulation film width versus delay time as a result of measurements made on a transistor having a gate length of 70 nm.

FIG. 28 is a graph of the width W1 of the offset insulation film versus the delay time $t_{pd}$ as a result of measurements made on a transistor having a gate length Lg=70 nm. It will be found from the graph that the smaller the width W1 of the offset insulation film, the shorter the delay time $t_{pd}$.

With reference to Equation (3), decreasing the width of the offset insulation film increases the gate overlap capacitance and thereby to increase the total capacitance C. This should increase the delay time $t_{pd}$. However, decreasing the width of the offset insulation film decreases the effective channel length to increase the current driving capability I. This influence is exerted more strongly than the influence of the increase in total capacitance C. As a result, the smaller the width W1 of the offset insulation film is, the shorter the delay time $t_{pd}$ becomes, as shown in FIG. 28.

From the foregoing, the digital circuits show that the smaller the width of the offset insulation film is, the shorter the delay time $t_{pd}$ becomes which in turn improves the performance of the circuits. Thus, there is a difference in optimum value for the width of the offset insulation film between a transistor constituting an analog circuit (or a radio-frequency circuit) and a transistor constituting a digital circuit. Based on these facts, description will be given on the semiconductor device including an analog circuit (or a radio-frequency circuit) and a digital circuit both formed on the same substrate, with a difference produced between the width of the offset insulation film of a transistor constituting the analog circuit (or radio-frequency circuit) and the width of the offset insulation film of a transistor constituting the digital circuit according to a sixth preferred embodiment of the present invention. The structure according to the sixth preferred embodiment is applicable to the semiconductor device of any one of the first to firth preferred embodiments.

Figure 29:
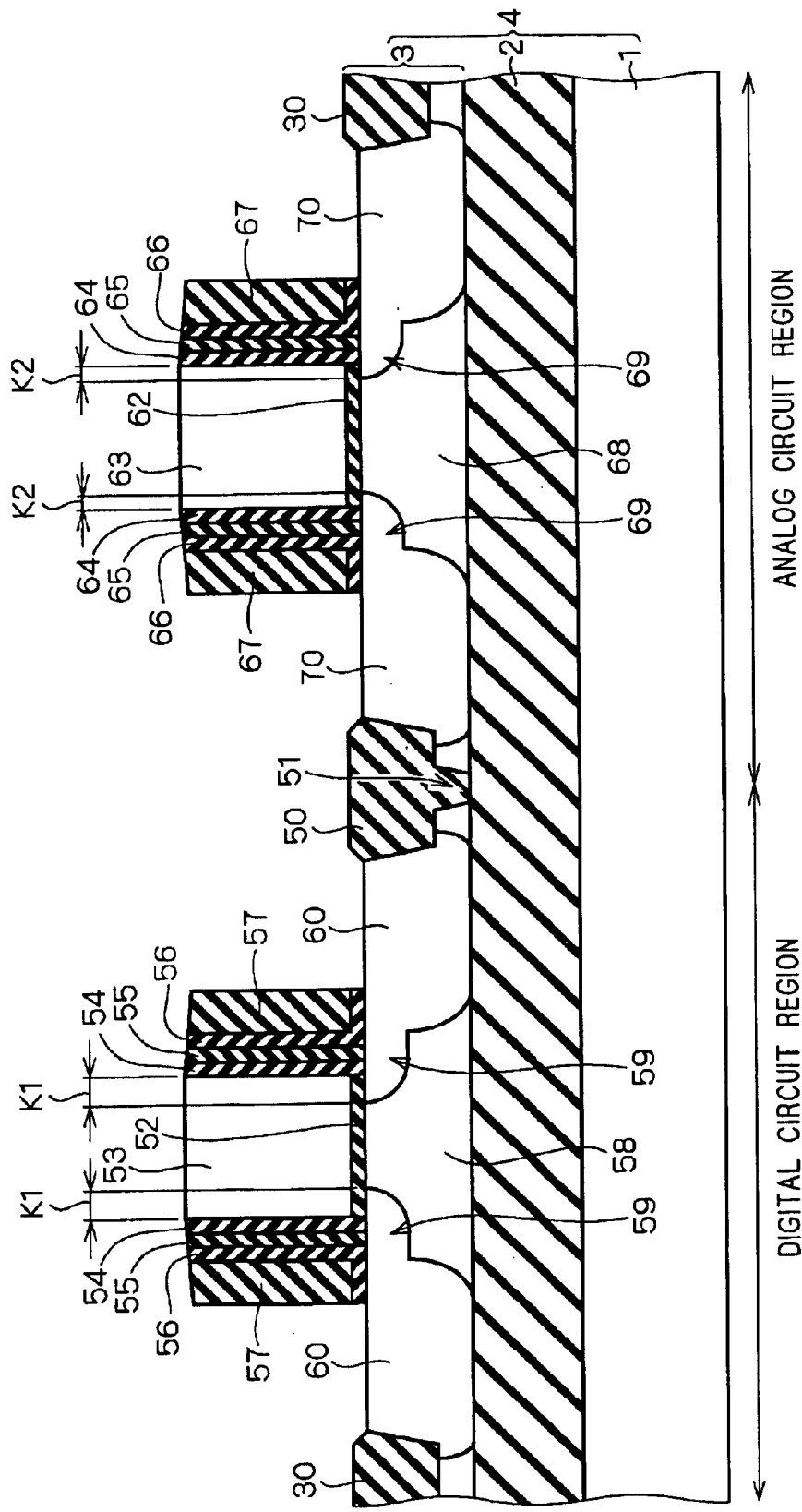
FIG. 29 is a sectional view showing a structure of a semiconductor device according to a sixth preferred embodiment of the present invention.

FIG. 29 is a sectional view showing a structure of the semiconductor device according to the sixth preferred embodiment. The SOI substrate 4 has a digital circuit region in which the digital circuit is formed and an analog circuit region in which the analog circuit is formed. The digital circuit region and the analog circuit region are electrically isolated from each other by an isolating insulation film 50 with a completely isolating portion 51 formed partially on the lower surface thereof.

The digital circuit region will be described first. A MOSFET constituting the digital circuit is formed in a device region defined by the isolating insulation films 30 and 50. The MOSFET has a gate electrode 53 of polysilicon formed on the upper surface of the silicon layer 3, with a gate oxide film 52 of silicon oxide therebetween; a body region 58 formed in the silicon layer 3 under the gate electrode 53; and a pair of source/drain regions 60 formed in the silicon layer 3, with the body region 58 disposed therebetween. The pair of source/drain regions 60 have a pair of extensions 59, respectively, which are formed in the upper surface of the silicon layer 3 and extend to under the gate electrode 53.

A silicon oxide film 54 serving as the offset insulation film is formed in contact with each side surface of the gate electrode 53. A silicon oxide film 55 is formed outside the silicon oxide film 54, and a sidewall including a silicon oxide film 56 and a silicon nitride film 57 is formed outside the silicon oxide film 55.

The analog circuit region will be described next. A MOSFET constituting the analog circuit is formed in a device region defined by the isolating insulation films 30 and 50. The MOSFET has a gate electrode 63 of polysilicon formed on the upper surface of the silicon layer 3, with a gate oxide film 62 of silicon oxide therebetween; a body region 68 formed in the silicon layer 3 under the gate electrode 63; and a pair of source/drain regions 70 formed in the silicon layer 3, with the body region 68 disposed therebetween. The pair of source/drain regions 70 have a pair of extensions 69, respectively, which are formed in the upper surface of the silicon layer 3 and extend to under the gate electrode 63. The gate length of the gate electrode 63 is equal to the gate length of the gate electrode 53.

A silicon oxide film 64 serving as a first offset insulation film is formed in contact with each side surface of the gate electrode 63. A silicon oxide film 65 serving as a second offset insulation film is formed outside the silicon oxide film 64. The silicon oxide film 64 is equal in thickness to the silicon oxide film 54, and the silicon oxide film 65 is equal in thickness to the silicon oxide film 55. A sidewall including a silicon oxide film 66 and a silicon nitride film 67 is formed outside the silicon oxide film 65.

The amount (or a dimension K1) of overlap between the gate electrode 53 and the extensions 59 as viewed in plan (or as viewed from above the gate electrode) is greater than the amount (or a dimension K2) of overlap between the gate electrode 63 and the extensions 69 as viewed in plan. As a result, the effective channel length of the MOSFET formed in the digital circuit region is less than that of the MOSFET formed in the analog circuit region.

Figure 30:
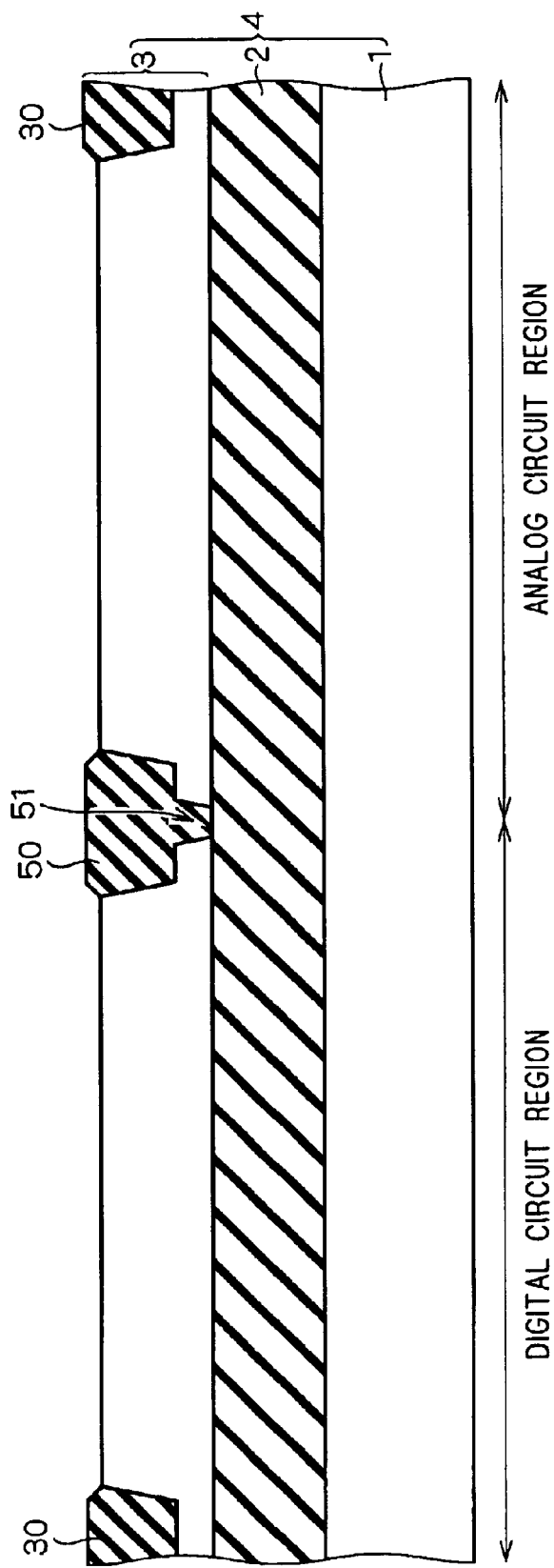
FIGS. 30 through 35 are sectional views showing a method of manufacturing the semiconductor device in a step-by-step manner according to the sixth preferred embodiment.

FIGS. 30 through 35 are sectional views showing a method of manufacturing the semiconductor device in a step-by-step manner according to the sixth preferred embodiment. Referring first to FIG. 30, the SOI substrate 4 is prepared, and then the isolating insulation films 30 and 50 are formed in the silicon layer 3.

Figure 31:
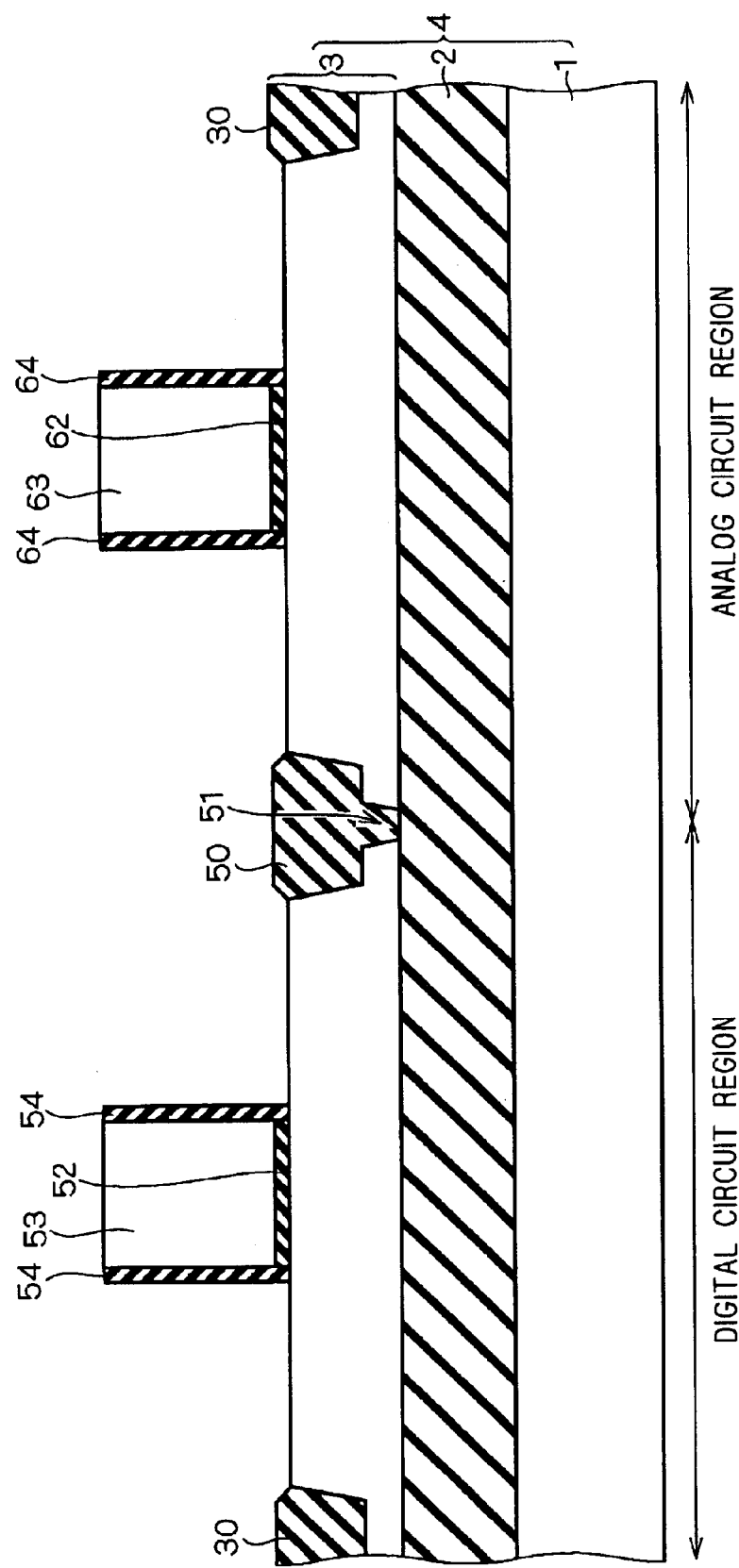

With reference to FIG. 31, a silicon oxide film is formed entirely on the upper surface of the silicon layer 3 and the upper surfaces of the isolating insulation films 30, 50 by a CVD process or a thermal oxidation process. A silicon oxynitride film, a metal oxide film such as $Al_2O_3$ or a ferroelectric film such as $Ta_2O_5$ and BST may be formed in place of the silicon oxide film. Next, a polysilicon film having a thickness of about 100 nm to about 400 nm is formed entirely on the upper surface of the silicon oxide film by an LPCVD process. The polysilicon film may be doped with an impurity such as P and B. A metal film such as W, Ta and Al may be formed in place of the polysilicon film. Next, the polysilicon film and the silicon oxide film are patterned by a photolithographic process and an anisotropic dry etching process to form the gate electrodes 53, 63 and the gate oxide films 52, 62.

Next, a silicon oxide film having a thickness of several to tens of nanometers are formed on the entire top surface of the resultant structure, and is etched by an anisotropic dry etching process which exhibits a higher etch rate in the direction of depth of the SOI substrate 4. This forms the silicon oxide film 54 in contact with each side surface of the gate electrode 53, and the silicon oxide film 64 in contact with each side surface of the gate electrode 63. The silicon oxide film 54 functions as the offset insulation film for the formation of the extensions 59 in a later step. The silicon oxide film 64 functions as the first offset insulation film for the formation of the extensions 69 in a later step.

Figure 32:
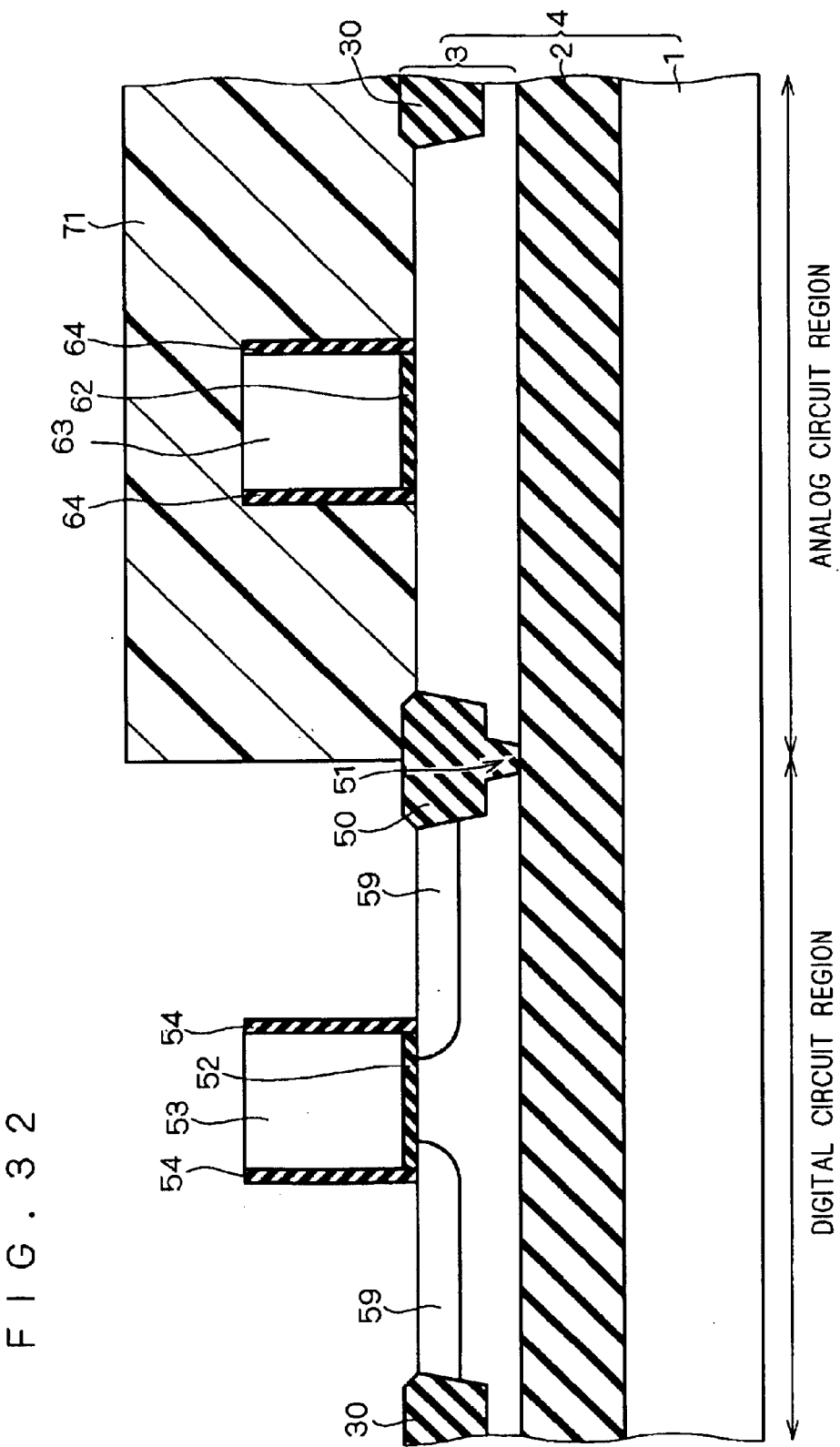

Next, with reference to FIG. 32, a photoresist 71 is formed on the silicon layer 3 in the analog circuit region by a photolithographic process to cover the gate electrode 63 and the silicon oxide film 64. Then, ions of impurity such as As, P and Sb (for the formation of an NMOS transistor) are implanted to form the extensions 59 in the upper surface of the silicon layer 3 in the digital circuit region.

Figure 33:
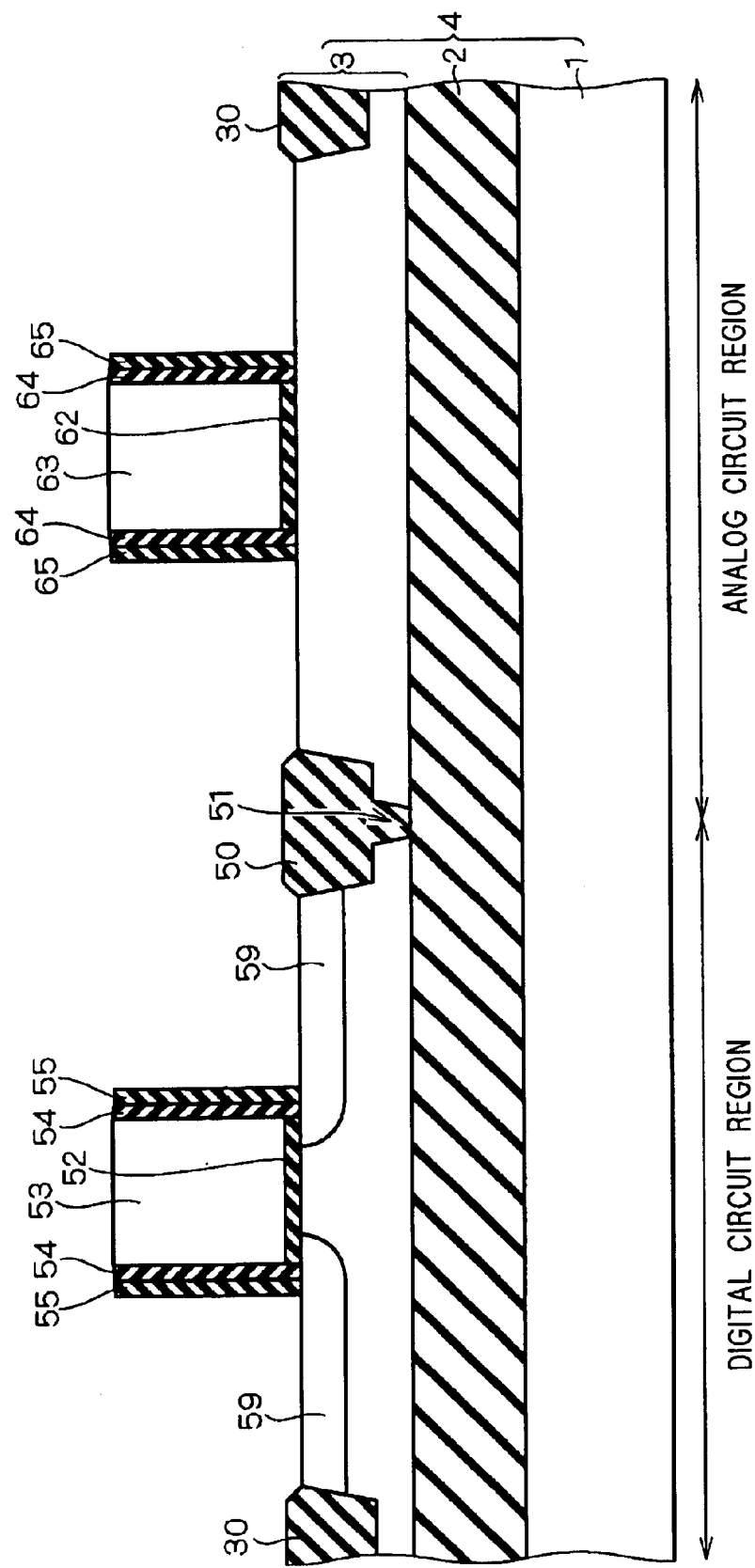

With reference to FIG. 33, after the photoresist 71 is removed, a silicon oxide film having a thickness of several to tens of nanometers are formed on the entire top surface of the resultant structure, and is etched by an anisotropic dry etching process which exhibits a higher etch rate in the direction of depth of the SOI substrate 4. This forms the silicon oxide film 55 outside the silicon oxide film 54, and the silicon oxide film 65 outside the silicon oxide film 64. The silicon oxide film 65 functions as the second offset insulation film for the formation of the extensions 69 in a later step.

Figure 34:
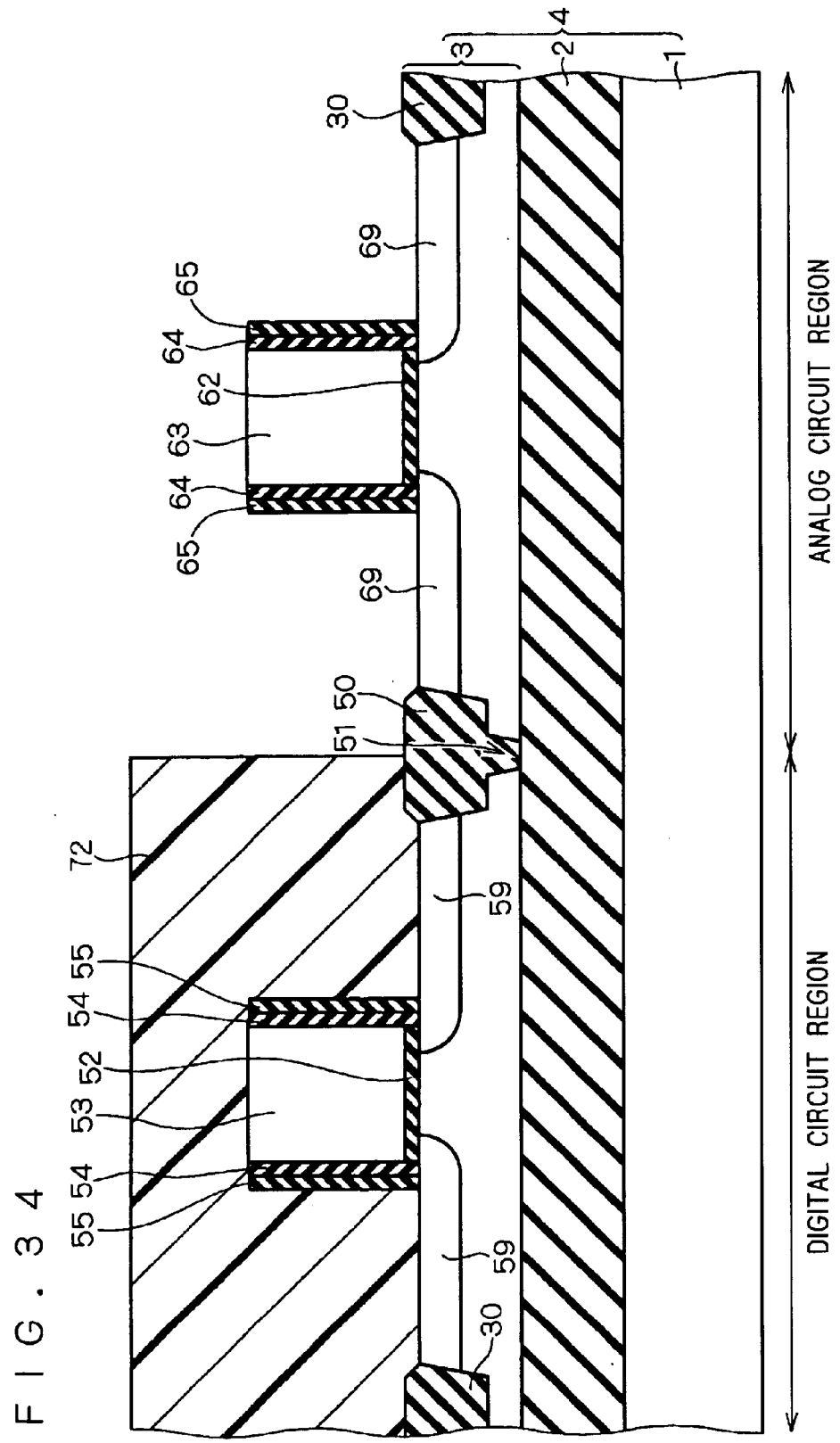

Next, with reference to FIG. 34, a photoresist 72 is formed on the silicon layer 3 in the digital circuit region by a photolithographic process to cover the gate electrode 53 and the silicon oxide films 54, 55. Then, ions of impurity such as As, P and Sb (for the formation of an NMOS transistor) are implanted to form the extensions 69 in the upper surface of the silicon layer 3 in the analog circuit region.

Figure 35:
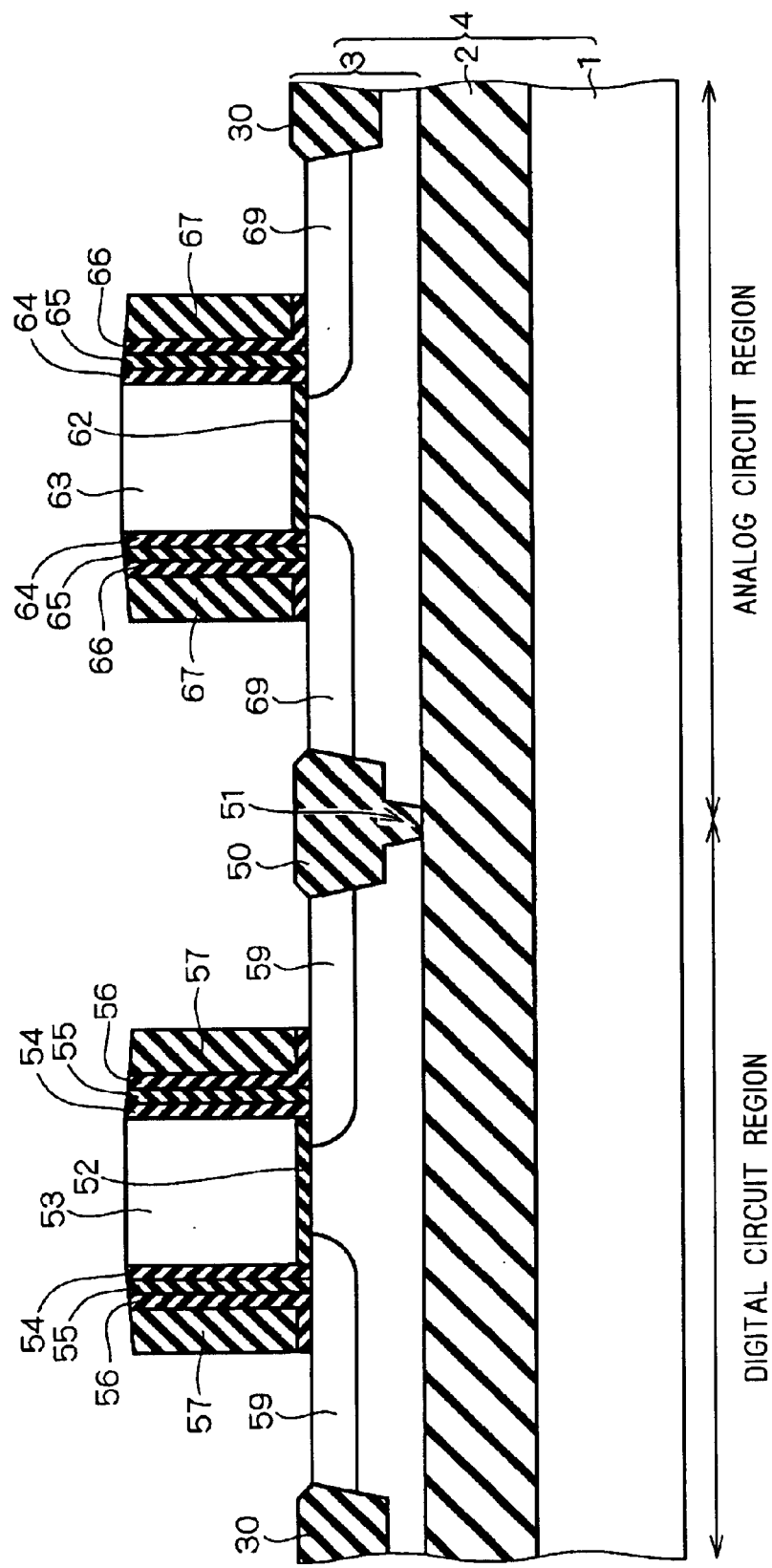

Referring to FIG. 35, after the photoresist 72 is removed, a silicon oxide film and a silicon nitride film are formed in the order named on the entire top surface of the resultant structure. Next, an anisotropic dry etching process is performed to etch the silicon oxide film and the silicon nitride film until the upper surface of the silicon layer 3 is exposed. This forms the sidewall including the silicon oxide film 56 and the silicon nitride film 57 outside the silicon oxide film 55, and the sidewall including the silicon oxide film 66 and the silicon nitride film 67 outside the silicon oxide film 65. These sidewalls function as an implant mask for the formation of the source/drain regions 60, 70 in a later step.

Subsequently, an impurity such as As, P and Sb (for the formation of an NMOS transistor) is introduced into the silicon layer 3 by an ion implantation process to form the source/drain regions 60, 70. The above-mentioned steps provide the structure shown in FIG. 29.

In the method of manufacturing the semiconductor device according to the sixth preferred embodiment, as stated above, the silicon oxide film 54 is used as the offset insulation film in the digital circuit region when the ion implantation is performed for the formation of the extensions 59. In the analog circuit region, on the other hand, the silicon oxide films 64 and 65 are used as the offset insulation films when the ion implantation is performed for the formation of the extensions 69. As a result, in the semiconductor device according to the sixth preferred embodiment, the amount (or dimension K1) of overlap between the gate electrode 53 and the extensions 59 as viewed in plan is greater than the amount (or dimension K2) of overlap between the gate electrode 63 and the extensions 69 as viewed in plan. This ensures the optimum value for the width of the offset insulation film for the transistor constituting the analog circuit (or radio-frequency circuit), while reducing the effective channel length to shorten the delay time $t_{pd}$, thereby improving the performance for the transistor constituting the digital circuit.

Although the reduction in effective channel length makes the short channel effect prone to occur in the transistor constituting the digital circuit, the influence of the short channel effect is less problematic in the digital circuit than in the analog circuit.

The sixth preferred embodiment has been described above taking the formation of the NMOS transistor as an example. The technique of the sixth preferred embodiment, however, is applicable to the formation of PMOS and CMOS transistors. This is also true for a seventh preferred embodiment according to the present invention to be described below.

Seventh Preferred Embodiment

It will be found from Expression (2) that the increase in maximum oscillation frequency $f_{max}$ can be achieved by reducing the gate resistance $R_g$. A gate structure capable of reducing the gate resistance will be described in the seventh preferred embodiment of the present invention. The gate structure according to the seventh preferred embodiment is applicable to the semiconductor device of any one of the first to sixth preferred embodiments.

Figure 36:
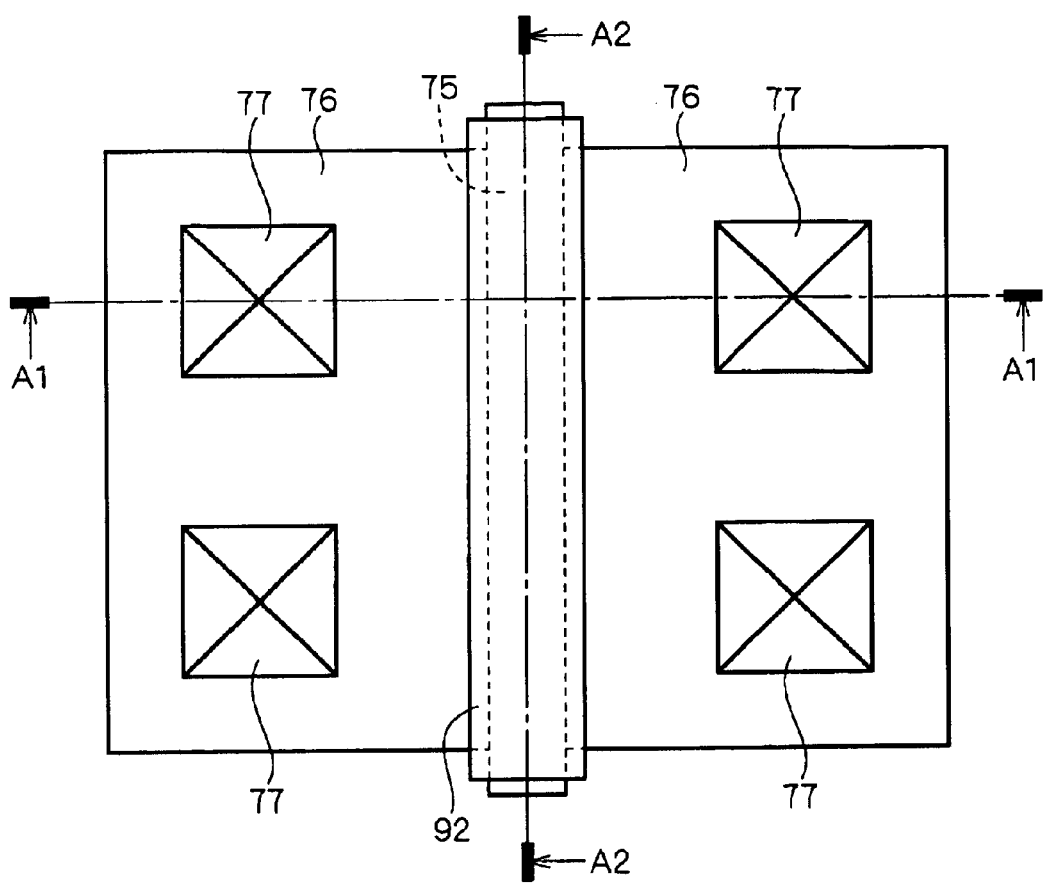
FIG. 36 is a schematic top plan view showing a structure of a semiconductor device according to a seventh preferred embodiment of the present invention.

FIG. 36 is a top plan view schematically showing a structure of a semiconductor device according to the seventh preferred embodiment of the present invention. A pair of source/drain regions 76 are formed on opposite sides of a gate electrode 75. A plurality of contact plugs 77 are formed in contact with the source/drain regions 76.

Figure 37:
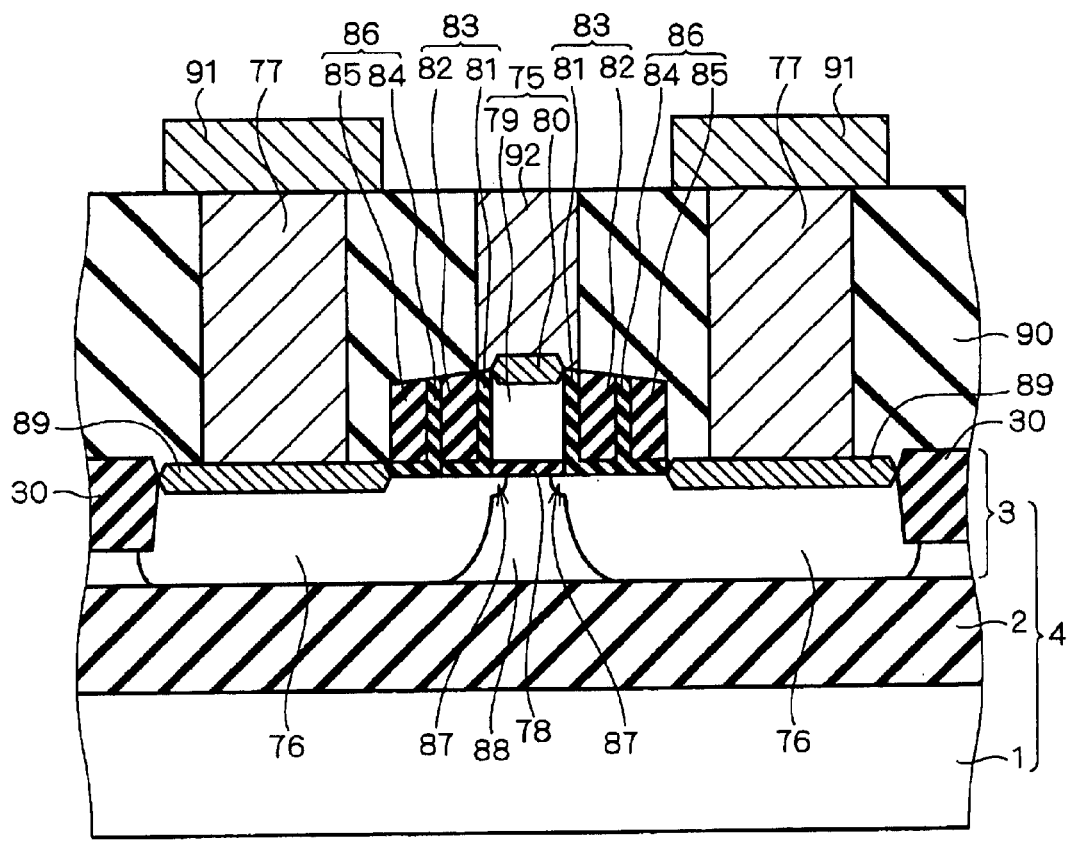
FIG. 37 is a sectional view of the structure taken along the line A1—A1 of FIG. 36.
Figure 38:
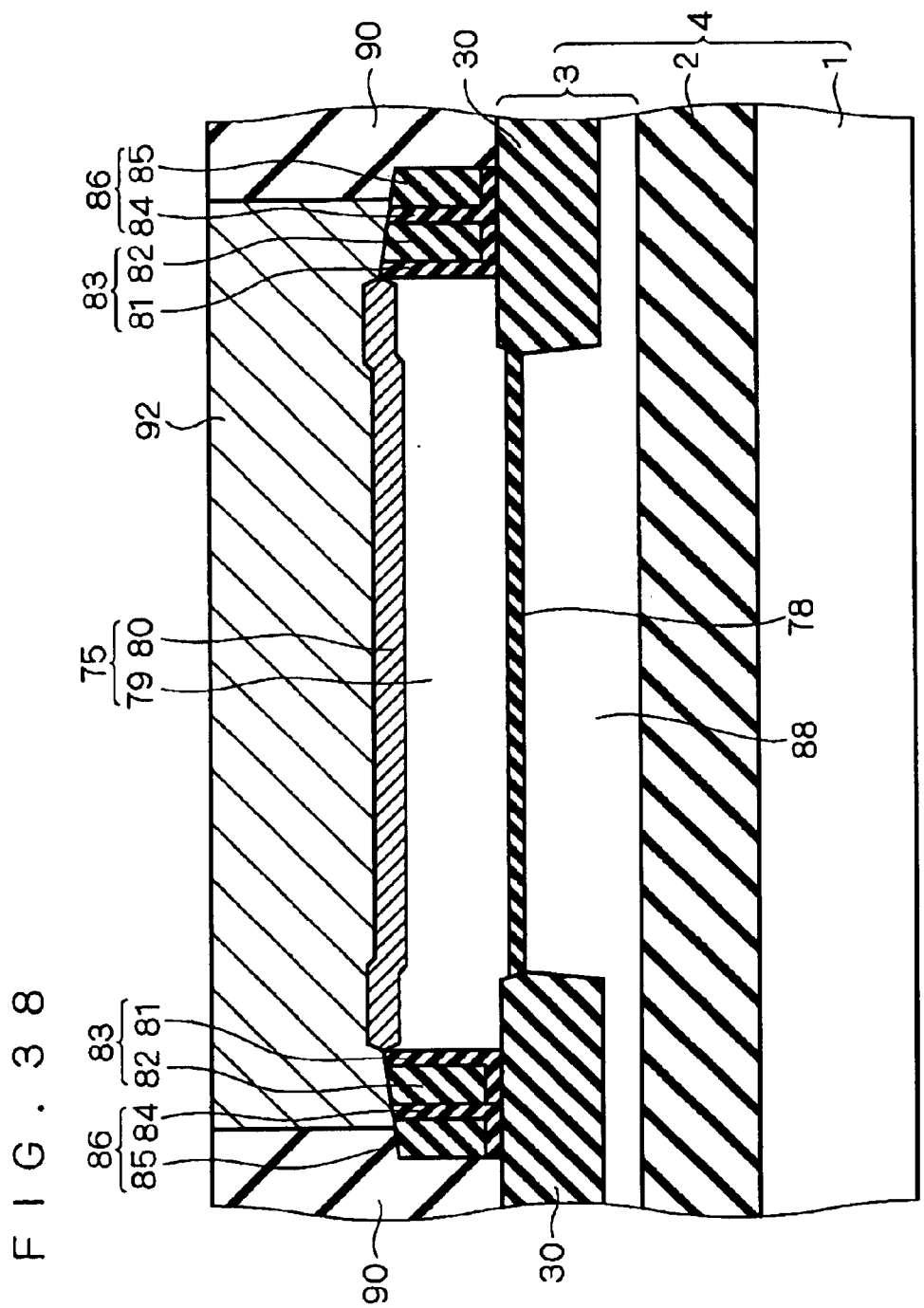
FIG. 38 is a sectional view of the structure taken along the line A2—A2 of FIG. 36.

FIG. 37 is a sectional view showing the structure taken along the line A1—A1 of FIG. 36. FIG. 38 is a sectional view showing the structure taken along the line A2—A2 of FIG. 36. With reference to FIG. 37, a polysilicon film 79 is formed on the upper surface of the silicon layer 3, with a gate oxide film 78 of silicon oxide therebetween. A metal silicide layer 80 is formed on the polysilicon film 79, and the polysilicon film 79 and the metal silicide layer 80 constitute the gate electrode 75. A sidewall 83 including a silicon oxide film 81 and a silicon nitride film 82 is formed on each side surface of the gate electrode 75. A sidewall 86 including a silicon oxide film 84 and a silicon nitride film 85 is formed on an opposite side surface of the sidewall 83 from the gate electrode 75.

A body region 88 is formed in the silicon layer 3 under the gate electrode 75. The pair of source/drain regions 76 are formed in the silicon layer 3, with the body region 88 disposed therebetween. The pair of source/drain regions 76 have a pair of extensions 87, respectively, which are formed in the upper surface of the silicon layer 3 and extend to under the gate electrode 75. A metal silicide layer 89 is formed on the upper surface of the source/drain regions 76 except where the sidewalls 83 and 86 are formed.

An interlayer insulation film 90 made of silicon oxide is formed on the silicon layer 3 to cover the MOSFET. The contact plugs 77 made of metal are formed through the interlayer insulation film 90 to reach from the upper surface of the interlayer insulation film 90 to the upper surface of the metal silicide layer 89. A metal interconnect line 91 made of metal such as aluminum and copper is formed on the upper surface of the interlayer insulation film 90 and is in contact with the contact plugs 77. A gate interconnect line 92 made of metal is formed through the interlayer insulation film 90 to reach from the upper surface of the interlayer insulation film 90 to the upper surfaces of the metal silicide layer 80 and the sidewall 83. A dimension of the gate interconnect line 92 in the direction of the gate length is greater than the gate length of the gate electrode 75.

With reference to FIG. 38, the gate interconnect line 92 is in contact with the upper surface of the gate electrode 75 and extends in the same direction as the gate electrode 75 extends.

Figure 39:
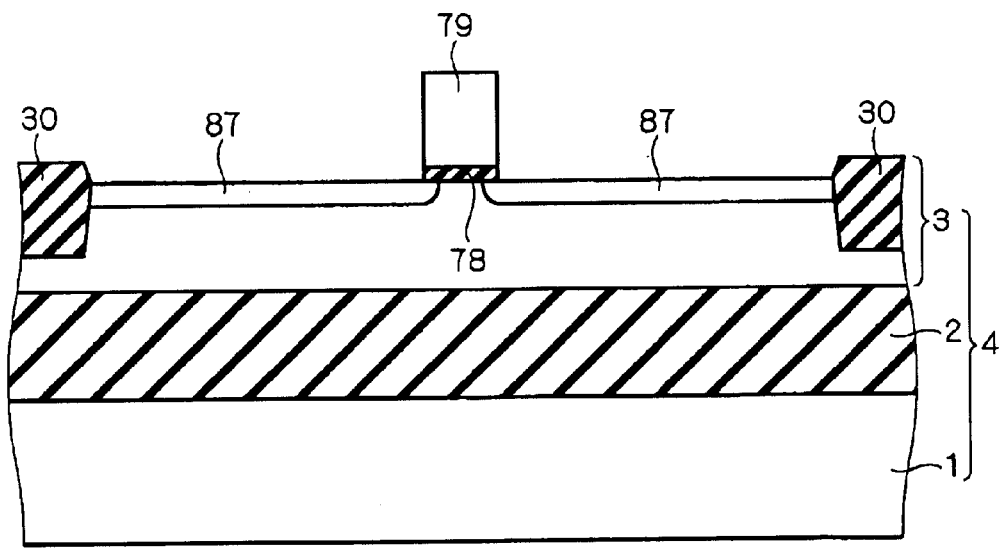
FIGS. 39 through 43 are sectional views showing a method of manufacturing the semiconductor device in a step-by-step manner according to the seventh preferred embodiment.

FIGS. 39 through 43 are sectional views showing a method of manufacturing the semiconductor device in a step-by-step manner according to the seventh preferred embodiment. Referring first to FIG. 39, the SOI substrate 4 is prepared, and then the isolating insulation film 30 is formed in the silicon layer 3. Next, the gate oxide film 78 and the polysilicon film 79 are formed on the upper surface of the silicon layer 3 by the process described in the above-mentioned preferred embodiments. Then, an impurity such as As, P and Sb (for the formation of an NMOS transistor) is introduced into the upper surface of the silicon layer 3 by an ion implantation process to form the extensions 87. Before the ion implantation process, the concepts of the first to sixth preferred embodiments may be applied to form the offset insulation film on the side surface of the polysilicon film 79, thereby increasing the effective channel length.

Figure 40:
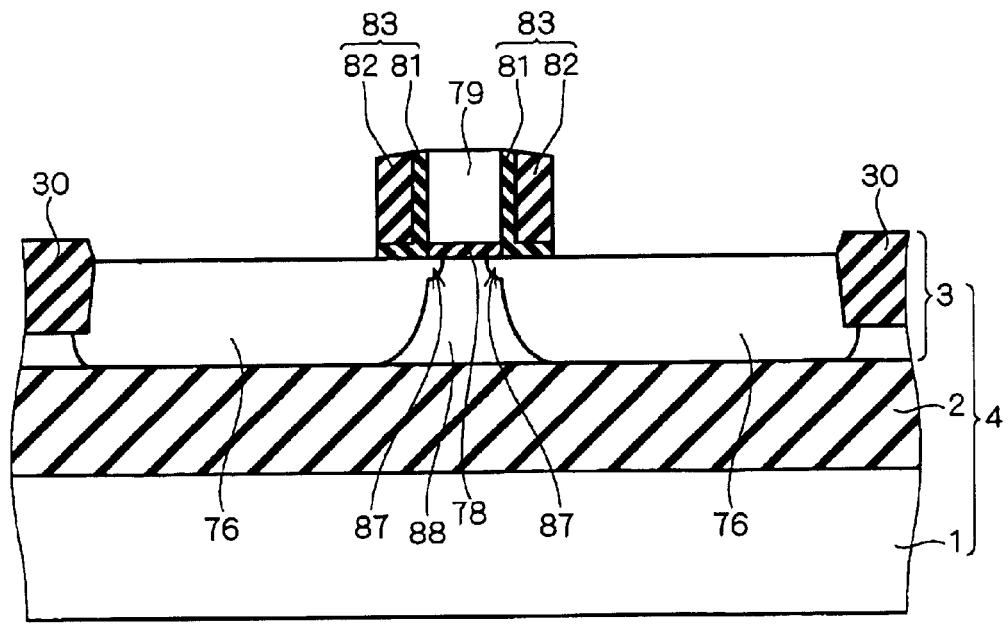

With reference to FIG. 40, a silicon oxide film and a silicon nitride film are formed in the order named on the entire top surface of the resultant structure by a CVD process. Next, an anisotropic dry etching process which exhibits a higher etch rate in the direction of depth of the SOI substrate 4 is performed to etch the silicon oxide film and the silicon nitride film until the upper surface of the silicon layer 3 is exposed. This leaves the silicon oxide film 81 and the silicon nitride film 82 unetched on each side surface of the polysilicon film 79 to form the sidewall 83. Next, an impurity such as As, P and Sb (for the formation of an NMOS transistor) is introduced into the silicon layer 3 by an ion implantation process to form the source/drain regions 76. The sidewall 83 functions as an implant mask in the ion implantation step for the formation of the source/drain regions 76.

Figure 41:
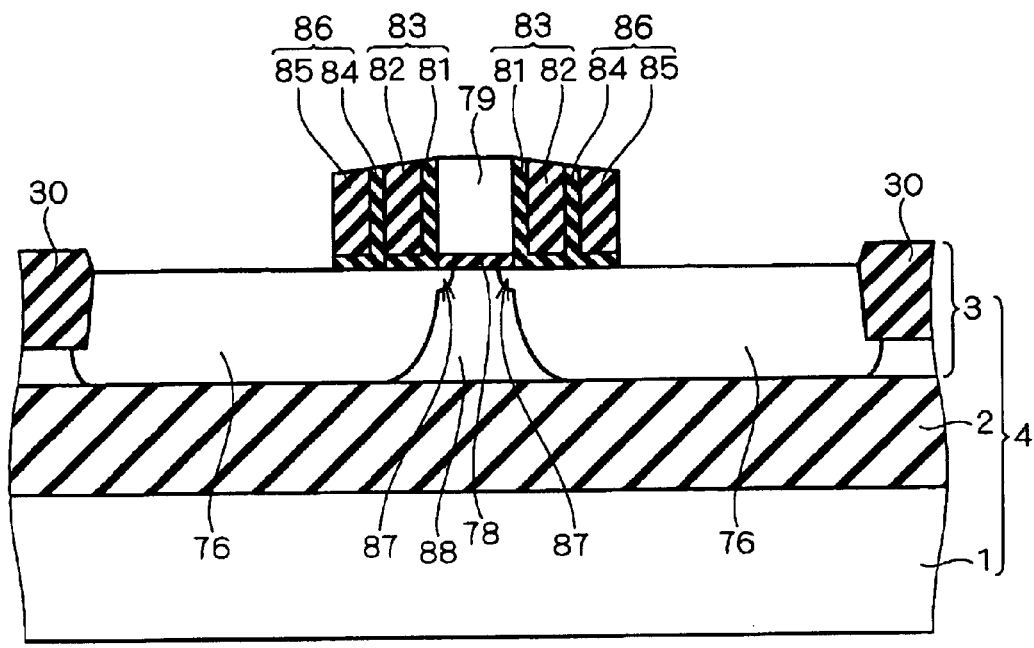

With reference to FIG. 41, a silicon oxide film and a silicon nitride film are formed in the order named on the entire top surface of the resultant structure by a CVD process. Next, an anisotropic dry etching process which exhibits a higher etch rate in the direction of depth of the SOI substrate 4 is performed to etch the silicon oxide film and the silicon nitride film until the upper surface of the silicon layer 3 is exposed. This leaves the silicon oxide film 84 and the silicon nitride film 85 unetched on a side surface of each sidewall 83 to form the sidewall 86. In this process, the thickness of the silicon nitride film and the etch conditions may be adjusted so that the sidewall 86 differs from the sidewall 83 in dimension in the direction of the gate length.

Figure 42:
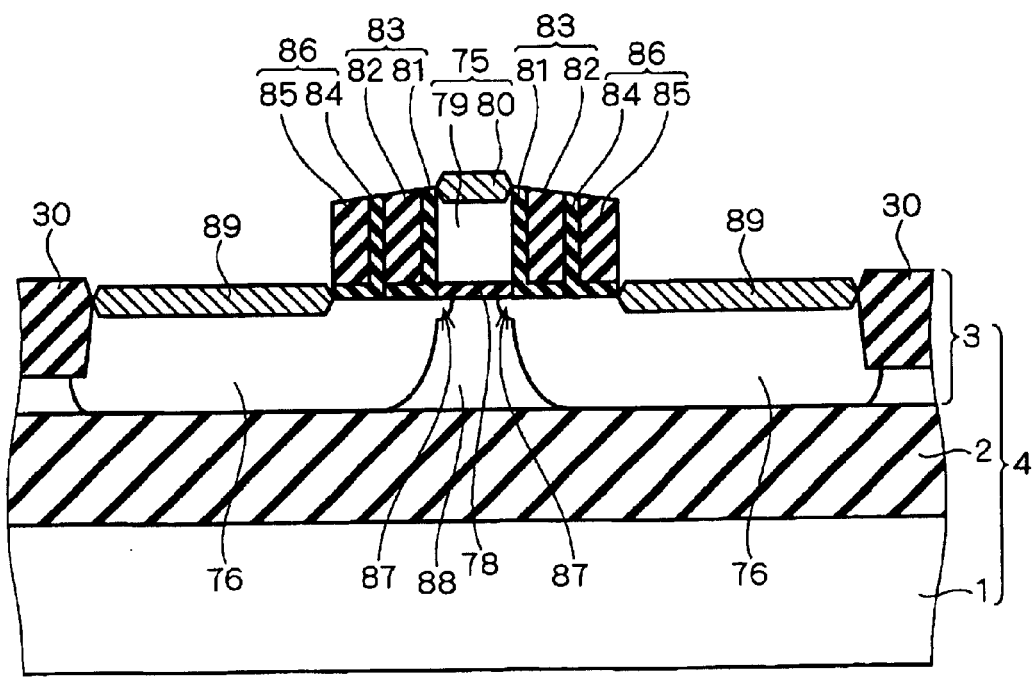

Referring to FIG. 42, a metal film such as cobalt is formed on the entire top surface of the resultant structure, and is then heated. This causes silicon and metal to react with each other in their contacting portions to form the metal silicide layers 80 and 89. The metal silicide layer 80 is formed on the polysilicon film 79, thereby to constitute the gate electrode 75. The metal silicide layer 89 is formed on the source/drain regions 76. Thereafter, the unreacted metal film is removed.

Figure 43:
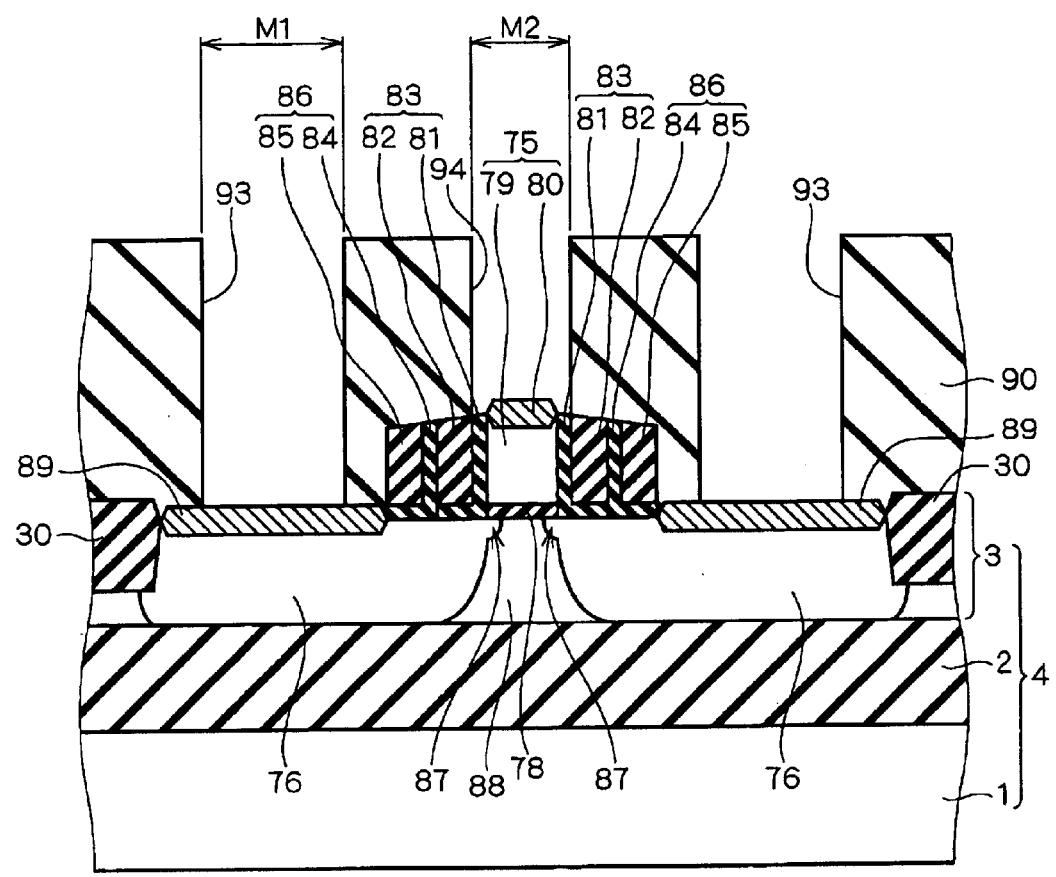

With reference to FIG. 43, a silicon oxide film is deposited on the entire top surface of the resultant structure by a CVD process to form the interlayer insulation film 90. Next, a photoresist (not shown) having a predetermined opening pattern is formed on the upper surface of the interlayer insulation film 90 by a photolithographic process. Using the photoresist as an etch mask, an anisotropic dry etching process which exhibits a higher etch rate in the direction of depth of the SOI substrate 4 is performed to remove the interlayer insulation film 90. Performing this etching process under conditions such that the silicon oxide film is more susceptible to etching and the silicon nitride film is less susceptible to etching prevents the upper surface of the sidewall 83 from being etched. This forms contact holes 93 on the metal silicide layer 89, and an interconnect trench or opening 94 on the gate electrode 75.

It is desirable to shape the opening pattern of the photoresist so that a dimension M1 of the contact holes 93 in the direction of the gate length is greater than a dimension M2 of the interconnect trench 94 in the direction of the gate length for reasons to be described below. The opening area of each contact hole 93 is less than the opening area of the interconnect trench 94 because the interconnect trench 94 extends along the gate electrode 75. Thus, the contact holes 93 are etched more slowly than the interconnect trench 94. Making the dimension M1 greater than the dimension M2 reduces the etch rate difference.

Next, a metal film (Al, W, Cu or the like) thick enough to fill the contact holes 93 and the interconnect trench 94 is formed on the entire top surface of the resultant structure, and is then etched back until the upper surface of the interlayer insulation film 90 is exposed. To improve the adhesion of the metal film, a barrier metal layer may be formed before the metal film is deposited. The material of the barrier metal layer is titanium (Ti), titanium nitride (TiN), a composite film of Ti and TiN, or the like. Thereafter, the metal interconnect line 91 is formed to provide the structure shown in FIG. 37.

As stated above, in the semiconductor device according to the seventh preferred embodiment, the gate interconnect line 92 formed through the interlayer insulation film 90 is in contact with the upper surface of the gate electrode 75, and extends in the same direction as the gate electrode 75 extends, the dimension of the gate interconnect line 92 in the direction of the gate length being greater than the gate length of the gate electrode 75. This reduces the gate resistance $R_g$ in Equation (2) to increase the maximum oscillation frequency $f_{max}$.

In the method of manufacturing the semiconductor device according to the seventh preferred embodiment, the sidewall 86 is formed outside each sidewall 83. This avoids contact between the gate interconnect line 92 and the metal silicide layer 89 if the interconnect trench 94 is not formed in its proper position because of the misalignment of the photomask and the like. Thus, the formation of the sidewall 86 improves a misalignment margin. The greater the dimension of the sidewall 86 in the direction of the gate length is, the greater this effect is.

However, the excessively great dimension of the sidewall 86 in the direction of the gate length reduces the dimension of the metal silicide layer 89 in the direction of the gate length to increase the series resistance of the source/drain. It is therefore necessary to weigh the advantage of being able to improve the misalignment margin against the drawback of increasing the series resistance of the source/drain to optimize the dimension of the sidewall 86 in the direction of the gate length.

The effect of improving the misalignment margin is produced by simply increasing the width of the sidewall 83 without individually forming the sidewall 83 and the sidewall 86. This technique, however, increases the distance between the pair of source/drain regions 76 and accordingly increases the length of the extensions 87 to increase the series resistance in the extensions 87, resulting in the reduction in current driving capability. On the other hand, the process for forming the source/drain regions 76 after the formation of the sidewall 83, and then forming the sidewall 86 as in the method of the seventh preferred embodiment can reduce the length of the extensions 87 to prevent the reduction in current driving capability.

While the invention has been described in detail, the foregoing description is in all aspects illustrative and not restrictive. It is understood that numerous other modifications and variations can be devised without departing from the scope of the invention.

What is claimed is:

1. A semiconductor device comprising:

an SOI substrate having a multi-layer structure including a semiconductor substrate, an insulation layer and a semiconductor layer stacked in the order named;

a first insulation film formed on a main surface of said semiconductor layer;

a gate electrode formed on said first insulation film;

a pair of second insulation films having respective inner side surfaces in contact with side surfaces of said gate electrode and respective outer side surfaces out of contact with said side surfaces of said gate electrode, with said gate electrode disposed between said pair of second insulation films;

a pair of third insulation films formed on said main surface of said semiconductor layer, with said first insulation film therebetween, and having respective inner side surfaces in contact with said outer side surfaces of said second insulation films and respective outer side surfaces out of contact with said outer side surfaces of said second insulation films, with said gate electrode and said second insulation films disposed between said pair of third insulation films;

a body region formed in said semiconductor layer under said gate electrode; and a pair of source/drain regions formed in said semiconductor layer, with said body region disposed between said pair of source/drain regions, said source/drain regions having respective extensions extending from under said outer side surfaces of said second insulation films toward said body region in said main surface of said semiconductor layer, wherein a lifetime killer is formed in said main surface of said semiconductor layer, wherein said third insulation films are made of silicon nitride, and wherein said third insulation films are formed directly on said main surface of said semiconductor layer without said first insulation film therebetween.

2. The semiconductor device according to claim 1, wherein a portion of said main surface of said semiconductor layer on which said third insulation films are formed is sunk toward said insulation layer below a portion of said main surface of said semiconductor layer on which said second insulation films are formed.

3. The semiconductor device according to claim 1, wherein a portion of said main surface of said semiconductor layer positioned outside said outer side surfaces of said third insulation films is sunk toward said insulation layer below a portion of said main surface of said semiconductor layer on which said third insulation films are formed.

4. The semiconductor device according to claim 1, further comprising a metal-semiconductor compound layer formed on said source/drain regions.

* * * * *